United States Patent
Luo et al.

(10) Patent No.: US 12,126,745 B2
(45) Date of Patent: Oct. 22, 2024

(54) FOLDABLE SCREEN DEVICE

(71) Applicant: HUAWEI TECHNOLOGIES CO., LTD., Guangdong (CN)

(72) Inventors: Junchao Luo, Shenzhen (CN); Wenji An, Shanghai (CN); Zhi Yuan, Shanghai (CN); Hongfan Lin, Shanghai (CN); Hanbiao Jin, Shanghai (CN); Wei Shan, Shanghai (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 17/843,558

(22) Filed: Jun. 17, 2022

(65) Prior Publication Data
US 2022/0321683 A1   Oct. 6, 2022

Related U.S. Application Data

(63) Continuation of application No. PCT/CN2020/135777, filed on Dec. 11, 2020.

(30) Foreign Application Priority Data

Dec. 20, 2019   (CN) .......................... 201911330567.4

(51) Int. Cl.
*H04M 1/02*   (2006.01)
(52) U.S. Cl.
CPC ......... *H04M 1/022* (2013.01); *H04M 1/0268* (2013.01); *H04M 1/0274* (2013.01)

(58) Field of Classification Search
CPC .......... G01V 3/38; G01V 3/08; G06F 1/1626; G06F 1/1677; H04M 1/0245
See application file for complete search history.

(56) References Cited

U.S. PATENT DOCUMENTS 11,516,932 B2 * 11/2022  Sim ...................... H05K 5/0226
2015/0233162 A1   8/2015  Lee et al.
(Continued)

FOREIGN PATENT DOCUMENTS

CN           1681380 A      10/2005
CN           1889818 A       1/2007
(Continued)

*Primary Examiner* — Lewis G West
(74) *Attorney, Agent, or Firm* — WOMBLE BOND DICKINSON (US) LLP

(57) ABSTRACT

This application provides a foldable screen device. The foldable screen device in this application includes two frames that are jointly articulated with a rotating shaft assembly. The two frames may rotate around rotating shafts of the rotating shaft assembly to be closed or opened. The rotating shaft assembly includes a connection structure and hinges. The connection structure has a channel that passes through two opposite sides of the rotating shaft assembly, and an electrical connection line of the foldable screen device penetrates into the channel. Two ends of the electrical connection line are respectively connected to the two frames, and the hinges and the channel are located at different positions of the rotating shaft assembly in an axial direction. In this way, bending deformation generated by the electrical connection line when the foldable screen device is folded is relatively small, and connection reliability is high.

20 Claims, 17 Drawing Sheets

(56) References Cited

U.S. PATENT DOCUMENTS

| | | | |
|---|---|---|---|
| 2017/0192460 A1* | 7/2017 | Watanabe | G02F 1/133305 |
| 2018/0198896 A1* | 7/2018 | Kang | G06F 1/1652 |
| 2018/0210496 A1* | 7/2018 | Lin | H04M 1/0214 |
| 2018/0292860 A1* | 10/2018 | Siddiqui | H04M 1/0268 |
| 2018/0324964 A1* | 11/2018 | Yoo | H01Q 1/2266 |
| 2019/0032380 A1* | 1/2019 | Wu | H04M 1/022 |
| 2019/0320048 A1 | 10/2019 | Yang et al. | |
| 2020/0081487 A1* | 3/2020 | Lin | H04M 1/0268 |
| 2020/0081494 A1* | 3/2020 | Lin | G06F 1/166 |
| 2020/0183464 A1* | 6/2020 | Lin | G06F 1/1616 |
| 2020/0341523 A1* | 10/2020 | Chen | E05D 3/122 |
| 2022/0357777 A1* | 11/2022 | Moon | H04M 1/022 |

FOREIGN PATENT DOCUMENTS

| | | |
|---|---|---|
| CN | 201178431 Y | 1/2009 |
| CN | 104750182 A | 7/2015 |
| CN | 108292148 A | 7/2018 |
| CN | 110445913 A | 11/2019 |
| CN | 109699151 B | 2/2020 |
| CN | 111147630 A | 5/2020 |
| JP | 2003087519 A | 3/2003 |
| JP | 2007158236 A | 6/2007 |
| JP | 2009089377 A | 4/2009 |
| JP | 2012023552 A | 2/2012 |
| JP | 2021501464 A | 1/2021 |
| WO | 2014122512 A1 | 8/2014 |

\* cited by examiner

FOLDABLE SCREEN DEVICE

CROSS-REFERENCE TO RELATED APPLICATIONS

This application is a continuation of International Patent Application No. PCT/CN2020/135777, filed on Dec. 11, 2020, which claims priority to Chinese Patent Application No. 201911330567.4, filed on Dec. 20, 2019. The disclosures of the aforementioned applications are hereby incorporated by reference in their entireties.

TECHNICAL FIELD

This application relates to the field of terminal devices, and in particular, to a foldable screen device.

BACKGROUND

With continuous improvement of people's living standards, more attention is paid to a screen display effect of a mobile terminal such as a mobile phone. However, a size of the mobile phone restricts expansion of a screen size.

Currently, to implement a relatively large screen size on a relatively small mobile phone, the mobile phone may use a foldable structure. The mobile phone may usually have two main bodies that can relatively rotate around a rotating shaft and can be folded, and a flexible screen body of a screen covers both surfaces of the two main bodies of the mobile phone. When the two bodies rotate around the rotating shaft between the bodies to be in a same plane, the screen is in an unfolded state and has a relatively large display area. When the two bodies rotate around the rotating shaft to be relatively folded, the mobile phone has a relatively small volume and size. Electronic components such as circuit boards are disposed in the two main bodies. An electrical connection between the electronic components in the different main bodies is implemented through a flexible electrical connection line that crosses two sides of the rotating shaft.

However, to adapt to folded and unfolded states of the mobile phone, the flexible electrical connection line needs to have a specific redundant length, and is in a different bending state as the mobile phone is opened or closed each time. In this way, the flexible electrical connection line is prone to break or scratch with another structure, and reliability is relatively poor.

SUMMARY

This application provides a foldable screen device, which has relatively high electrical connection reliability.

According to a first aspect, this application provides a foldable screen device, including two frames, a rotating shaft assembly articulated with the two frames, and an electrical connection line. The two frames may rotate around rotating shafts of the rotating shaft assembly to be closed or opened. The rotating shaft assembly includes a connection structure and hinges. The hinge is connected between the connection structure and the frame, the connection structure has channels passing through two opposite sides of the rotating shaft assembly, two ends of the electrical connection line are respectively connected to the two frames, the electrical connection line penetrates into the channel, and the channel and the hinge are located at different positions of the rotating shaft assembly in an axial direction. In this way, the electrical connection line is positioned by the rotating shaft assembly, so that bending deformation generated by the electrical connection line when the foldable screen device is folded is relatively small, and a bending amount is prone to control. Therefore, connection reliability is high.

In one embodiment, the connection structure is located in a middle region of the rotating shaft assembly in an axial direction. In this way, a region in which the connection structure is located may form a static accommodation space, and the electrical connection line positioned by the connection structure may pass through and be accommodated in the region, and is not interfered by a structure such as the rotating shaft during rotation.

In one embodiment, the connection structure includes a first shaft cover and a second shaft cover, the first shaft cover and the second shaft cover are disposed opposite to each other, the first shaft cover is located on a side that is of the rotating shaft assembly and that is close to articulated ends of the frames, the second shaft cover is located on a side that is of the rotating shaft assembly and that is close to free ends of the frames, and the first shaft cover and the second shaft cover enclose a space that can accommodate the rotating shafts. In this way, the first shaft cover and the second shaft cover jointly form the accommodation space, and the electrical connection line is accommodated inside the accommodation space. Therefore, the electrical connection line is shielded and protected by the first shaft cover and the second shaft cover. In this way, structure reliability is relatively high, and appearance is relatively good.

In one embodiment, the connection structure further includes a positioning piece, the positioning piece is located in the space jointly enclosed by the first shaft cover and the second shaft cover, and the channel is jointly formed by the positioning piece and one of the first shaft cover and the second shaft cover.

In this way, the positioning piece and the first shaft cover or the second shaft cover jointly form a positioning point located at the middle segment of the electrical connection line, and positions of the middle segment and end parts of the electrical connection line are all positioned, so that a length of a part that can be freely bent and that is of the electrical connection line is reduced, and correspondingly, a bending deformation amplitude is also reduced. In addition, the entire electrical connection line is divided into two segments with similar lengths in a length direction, bending deformation amounts of the two segments of the electric connection line are relatively similar, and deformation and displacement of the two segments are relatively synchronous. In this way, the electrical connection line positioned with the aid of the rotating shaft assembly generates small bending deformation when the foldable screen device is folded, and a bending amount is prone to control. Therefore, connection reliability is high.

In one embodiment, the positioning piece and the first shaft cover jointly enclose the channel.

In one embodiment, the foldable screen device further includes a first magnetic piece and a second magnetic piece. The first magnetic piece is disposed on the first shaft cover, the second magnetic piece is disposed on the positioning piece, and the first magnetic piece and the second magnetic piece are attractable to each other, so that the positioning piece and the first shaft cover are positioned to each other. In this way, by using the magnetic force of the magnetic pieces, the electrical connection line may be disposed on an assembly component in advance in an assembly process of the rotating shaft assembly, to prevent the electrical connection line from being detached from an assembly position due to external pulling or other forces, and effectively reduce assembly difficulty. In addition, by using an attraction function of the magnetic pieces, the first shaft cover and the positioning piece can clamp tightly, or the electrical connection line can be attached to the first shaft cover, to assist in positioning the electrical connection line.

In one embodiment, both the first magnetic piece and the second magnetic piece are magnets.

In one embodiment, one of the first magnetic piece and the second magnetic piece is a magnet, and the other is a soft magnet. In this way, the first magnetic piece and the second magnetic piece are disposed in a relatively free manner, and structures are relatively simple.

In one embodiment, the positioning piece includes a first positioning part, the first positioning part is located on a side that is of the positioning piece and that faces the first shaft cover, and the top of the first positioning part protrudes from an outer side of another part of the positioning piece and presses against the first shaft cover. In this way, the first positioning part may be connected to the first shaft cover, so that the positioning piece and the first shaft cover have fixed relative positions.

In one embodiment, there are at least two first positioning parts distributed on two opposite sides of the positioning piece in an axial direction of the rotating shaft, and there is a spacing that is between the first positioning parts located on the two opposite sides in a length direction of the positioning piece and that is used for the electrical connection line to pass through. In this way, spacings can be maintained between different parts of the positioning piece and the first shaft cover by using the plurality of first positioning parts.

In one embodiment, the positioning piece further includes a second positioning part, and the second positioning part is located on a side that is of the positioning piece and that faces the second shaft cover, and is connected to the second shaft cover. In this way, the second positioning part enables the positioning piece and the second shaft cover to have a fixed relative position.

In one embodiment, the electrical connection line includes a flexible printed circuit board. The flexible printed circuit board includes a plurality of leads, so that transmission of a plurality of different electrical signals can be implemented.

In one embodiment, the first shaft cover has a first fixing surface facing the positioning piece, the positioning piece has a second fixing surface facing the first shaft cover, the first fixing surface and the second fixing surface are disposed opposite to each other to form the channel, and the flexible printed circuit board is clamped between the first fixing surface and the second fixing surface. In this way, a gap used to allow penetration of the flexible printed circuit board is formed between the second fixing surface and the first shaft cover, so that the flexible printed circuit board can be positioned in a direction perpendicular to a board surface of the flexible printed circuit board, and the flexible printed circuit board is clamped by the positioning piece and the first shaft cover and cannot be largely bent or deformed with rotation of the frame.

In one embodiment, both the first fixing surface and the second fixing surface are concave-convex surfaces, and concave and convex directions of the concave-convex surfaces face a thickness direction of the flexible printed circuit board. In this case, a channel having a concave-convex shape is formed between the positioning piece and the first shaft cover, and a corresponding concave-convex shape is also formed on the flexible printed circuit board that passes through the channel. In this way, the flexible printed circuit board is in contact with a concave-convex channel wall, and is blocked by the channel wall, to prevent the flexible printed circuit board from moving forward and backward in a length direction of the flexible printed circuit board.

In one embodiment, the electrical connection line further includes a cable, and the flexible printed circuit board and the cable are spaced apart and disposed side by side. The cable may be configured to transmit different signals such as a coaxial signal, and the cable and the flexible printed circuit board are disposed relatively independently without interference or mutual impact.

In one embodiment, a guide groove is provided on the second fixing surface of the positioning piece, the guide groove passes through two opposite sides in a width direction of the positioning piece, a groove opening of the guide groove faces the first shaft cover, and the cable penetrates into the guide groove. A cable segment that is of the cable and that is located between the positioning piece and the first shaft cover may be partially or all buried in the guide groove, to be positioned.

In one embodiment, the cable has an axial positioning protrusion, the guide groove has a recess part, and the axial positioning protrusion is clamped in the recess part to fasten the cable in the guide groove. In this way, when the cable is disposed in the guide groove, an axial positioning protrusion of the cable is located in the recess portion, and a side wall of the recess portion can limit displacement of the cable in a length direction.

In one embodiment, the guide groove is further provided with an avoidance notch, and a shape of the avoidance notch matches a shape of the axial positioning protrusion. In this way, the cable having the axial positioning protrusion can enter the guide groove through the avoidance notch, and is positioned by the guide groove.

In one embodiment, the guide groove has a plurality of bending segments that are sequentially connected, a bending direction of the bending segment faces a radial direction of the cable, and bending directions of two adjacent bending segments are different. These bending segments guide a plurality of different cable segments in different directions. The guide groove causes relatively great resistance to the cable to prevent the cable from sliding relative to a cable groove in a length direction.

In one embodiment, a reinforcement steel sheet is disposed at an end part of the flexible printed circuit board, the reinforcement steel sheet is fastened to the frame, and an elastic cushion is disposed between the reinforcement steel sheet and the frame. In this way, the end part of the flexible printed circuit board can be connected to the frame by using the reinforcement steel sheet. In addition, because the elastic cushion has a particular deformation capability, a particular gap is formed between the reinforcement steel sheet and the corresponding frame. A small position error of a connection point position between the end part of the flexible printed circuit board and the frame can be compensated for through elastic deformation of the elastic cushion, thereby avoiding a risk that the flexible printed circuit board is tensed or even broken due to an insufficient length.

In one embodiment, the cable groove is provided in the frame, an end part of the cable is disposed in the cable groove, and the reinforcement steel sheet covers an outer side of a groove opening of the cable groove, to fasten the end part of the cable in the cable groove. In this way, the end part of the cable can be connected to the frame.

In one embodiment, the foldable screen device further includes a flexible protective cover. Edges of two opposite sides of the flexible protective cover are respectively connected to the two frames, and the flexible protective cover covers a side that is of the electrical connection line and that faces the free end of the frame. When the foldable screen device is opened and closed, the flexible protective cover is blocked between the electrical connection line and an outer structure, to prevent the outer structure from contacting the electrical connection line.

In one embodiment, the flexible protective cover has a corrugated cover body. In this case, the entire flexible protective cover has an uneven corrugated surface, and the corrugated surface may be correspondingly unfolded or folded when the foldable screen device is opened or closed, to form protection regions of different sizes to adapt to different opening and closing angles of the foldable screen device.

In one embodiment, the flexible protective cover is made of a thermally conductive material. In this way, the flexible protective cover connected between the different frames can transfer heat on a frame to another frame, so that temperatures of the two frames are relatively uniform. However, a temperature difference between parts that are of the flexible screen and that are correspondingly disposed on different frames is relatively small, and display uniformity is relatively good.

In one embodiment, the flexible protective cover has a heat dissipation surface that is attached to a surface of the frame. The heat dissipation surface has a relatively large heat dissipation area. Therefore, the flexible protective cover can implement a relatively fast heat conduction speed by using the heat dissipation surface and the frame, so that there is relatively good temperature uniformity between the first frame and the second frame.

In this application, the foldable screen device includes a first frame, a second frame, and the rotating shaft assembly connected between the first frame and the second frame. The connection structure in the rotating shaft assembly forms a channel through which an electrical connection line can pass and that can fasten the electrical connection line. In this way, the electrical connection line is positioned by the rotating shaft assembly, and therefore, a length of a part that can be freely bent and that is of the electrical connection line is reduced, and correspondingly, a bending deformation amplitude is also reduced. In addition, the entire electrical connection line is divided into two segments with similar lengths in a length direction, bending deformation amounts of the two segments of the electric connection line are relatively similar, and deformation and displacement of the two segments are relatively synchronous. In this way, the electrical connection line positioned with the aid of the rotating shaft assembly generates small bending deformation when the foldable screen device is folded, and a bending amount is prone to control. Therefore, connection reliability is high

DESCRIPTION OF REFERENCE NUMERALS

1—first frame; 2—second frame; 3—rotating shaft assembly; 4—electrical connection line; 5—flexible protective cover;
31—connection structure; 32—hinge; 41—flexible printed circuit board; 42—cable; 51—heat dissipation surface;
100—foldable screen device; 200—flexible screen; 311—first shaft cover; 312—positioning piece; 313—second shaft cover;
314—first magnetic piece; 315—second magnetic piece; 321—rotating shaft; 322—articulated arm; 323—support; 411—reinforcement steel sheet;
412—elastic cushion; 421—axial positioning protrusion;
3111—first fixing surface; 3112—connection rod; 3113—first installation slot; 3121—second positioning part;
3122—first positioning part; 3123—guide groove; 3123a—operation; 3124—recess part; 3125—second fixing surface;
3126—avoidance notch; 3127—third positioning part; 3128—auxiliary hole; and 3111a and 3125a—straight-line bending segments.

DESCRIPTION OF EMBODIMENTS

Before embodiments of this application are described, to facilitate understanding of the technical solutions of this application, basic concepts and terms in embodiments of this application are first explained and described.

With emergence of a flexible screen, a terminal device such as a mobile phone may implement screen bending and folding by using the flexible screen, so that the terminal device has a relatively compact size, and the flexible screen has a relatively large display area. Correspondingly, the terminal device may be a foldable screen device or a curved screen device.

Figure 1:
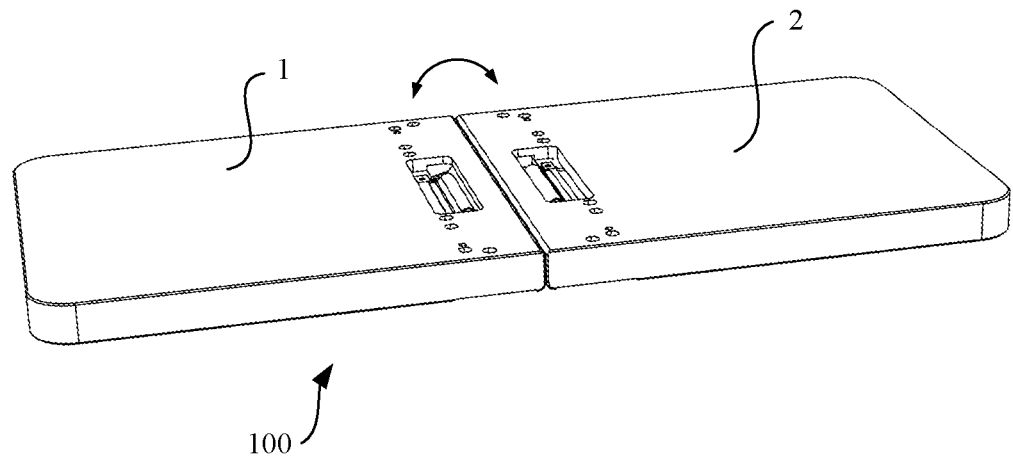
FIG. 1 is a schematic diagram of a structure of a foldable screen device according to an embodiment of this application.
Figure 2A:
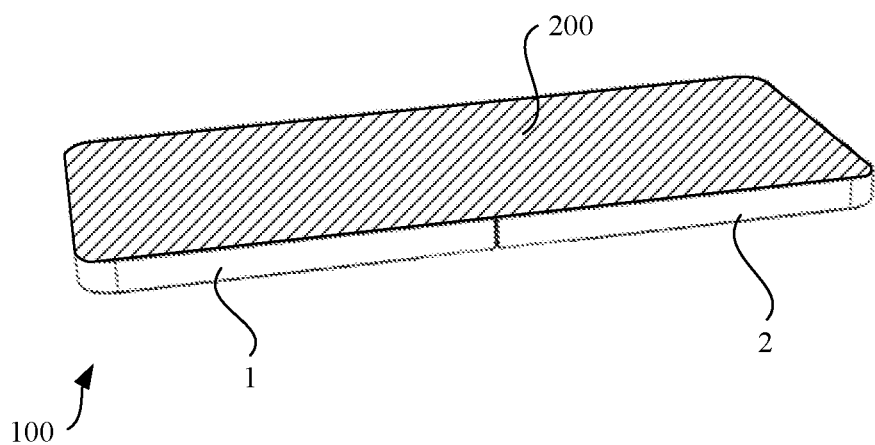
FIG. 2a is a schematic diagram of a structure of the foldable screen device in FIG. 1 in an unfolded state.
Figure 2B:
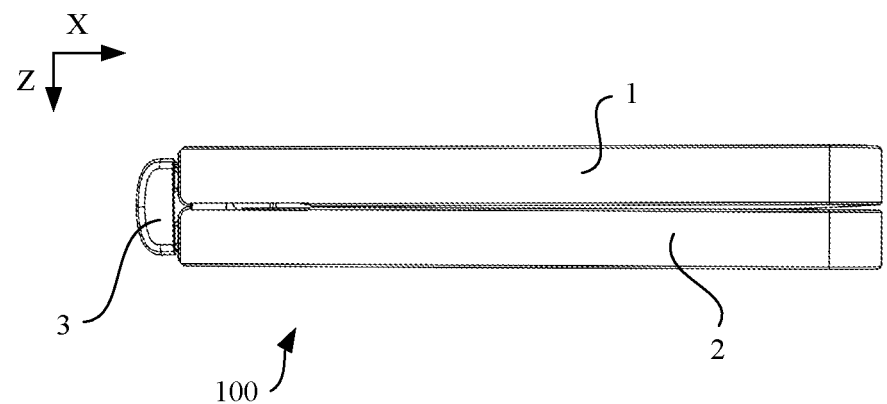
FIG. 2b is a schematic diagram of a structure of the foldable screen device in FIG. 1 in a folded state.

FIG. 1 is a schematic diagram of a structure of a foldable screen device according to an embodiment of this application. FIG. 2a is a schematic diagram of a structure of the foldable screen device in FIG. 1 in an unfolded state. FIG. 2b is a schematic diagram of a structure of the foldable screen device in FIG. 1 in a folded state. As shown in FIG. 1, FIG. 2a, and FIG. 2b, a foldable screen device 100 includes two frames and a flexible screen 200 disposed on these frames. End parts that are of the adjacent two frames and that are close to a rotating shaft may rotate around the rotating shaft located between the two frames, so that ends that are of the two frames and that are away from the rotating shaft are relatively close to or away from each other, and the foldable screen device 100 may correspondingly present different states such as a folded state or an unfolded state. The flexible screen 200 covers surfaces of the frames, and may accordingly present a folded state, an unfolded state, or the like as positions of the adjacent frames change. In one embodiment, the foldable screen device 100 includes a first frame 1 and a second frame 2. When the first frame 1 and the second frame 2 are unfolded, the first frame 1 and the second frame 2 are disposed side by side and on a same plane. Correspondingly, after the flexible screen 200 covering the surfaces of the frames is unfolded, a relatively large display surface may be formed, and the display surface may serve as an independent screen for displaying, as shown in FIG. 2a. It should be noted that a quantity of frames of the foldable screen device 100 may be two or more. When there are more than two frames, adjacent frames may rotate around rotating shafts parallel to each other, to form a multi-layer folded structure or be unfolded to form a larger display area. In this application, an example in which the foldable screen device 100 has two frames is mainly used for description.

A person skilled in the art may understand that a rotating shaft located between two adjacent frames may be a physical rotating shaft, or may be a virtual rotating shaft. When the rotating shaft is a virtual rotating shaft, the rotating shaft is not completely formed by physical components of the foldable screen device, but is a virtual rotating line formed by using shape constraints and displacement constraints of different components of the foldable screen device during relative movement. The two adjacent frames of the foldable screen device relatively rotate around the virtual rotating shaft during relative movement.

Components such as a primary circuit board, a processor, a memory, and a camera assembly inside the foldable screen device may be separately fastened to the first frame 1 or the second frame 2. For example, the components such as the primary circuit board, the processor, and the memory may be disposed inside the first frame 1, and the second frame 2 may be configured to carry the components such as the camera assembly and an antenna. In this case, to form an electrical connection between the components located in different frames, an electrical connection line is further disposed in the foldable screen device. Two ends of the electrical connection line are respectively connected to electrical connection points of the two adjacent different frames, to be connected to the different components such as the primary circuit board, the processor, the camera assembly, or the antenna in the frames and transmit an electrical signal. The electrical connection line is made of a flexible material, and may be accordingly bent or deformed as relative positions of the frames change. In this way, when the foldable screen device is in different states such as a folded state or an unfolded state, the electrical connection line can still maintain the electrical connection between the two adjacent frames depending on bending deformation of the electrical connection line.

In one embodiment, the electrical connection line may have a plurality of different structures and forms. The primary circuit board in the foldable screen device may be located in one of the frames, and the primary circuit board transmits an electrical signal to a plurality of other components. To implement an electrical connection between the primary circuit board and a component located in another frame, the electrical connection line includes a flexible printed circuit board (FPC). The flexible printed circuit board may include a plurality of leads, so that transmission of a plurality of different electrical signals can be implemented. In addition, the components such as the antenna in the foldable screen device may be electrically connected to the primary circuit board by using a coaxial cable. Therefore, in one embodiment, the electrical connection line may also include a single independently disposed cable, and the cable may be configured to implement signal transmission between two independent components. In this embodiment, a single cable may be configured to transmit different signals such as a coaxial signal.

However, to fold or unfold the flexible screen, the foldable screen device needs to have a relatively large unfolding and folding angle. For example, in the foldable screen device in FIG. 1, an angle formed between the two frames of the foldable screen device may change between 0° and 180°. Accordingly, a spacing between two ends of the electrical connection line also changes in a relatively large range. Therefore, when the flexible screen is folded, a relatively long redundant length needs to be reserved for the electrical connection line, to adapt to the spacing between the electrical connection points on the two frames when the flexible screen is unfolded. When the redundant length of the electrical connection line is excessively long, the electrical connection line is only in a large-angle bending state in a region between the two frames, and then can be normally accommodated between the two frames. In addition, after the foldable screen device is opened and closed each time, the electrical connection line may be in a different bending state. Each time the foldable screen device is opened or closed, the electrical connection line switches between a large-angle bending state and an extended state, and the electrical connection line is prone to break or fail due to material fatigue. In addition, when the electrical connection line is bent at a large angle between the frames, the electrical connection line is prone to generate friction or scratch with another component inside the foldable screen device, to cause damage to a surface of the electrical connection line.

Therefore, this application provides a foldable screen device, so that a screen can be folded or unfolded through relative rotation of frames. In addition, an electrical connection line used to maintain an electrical connection between adjacent frames has relatively high reliability, and is not prone to break or wear. The following separately describes a structure of the foldable screen device by using different scenarios as examples.

Scenario 1

Figure 3:
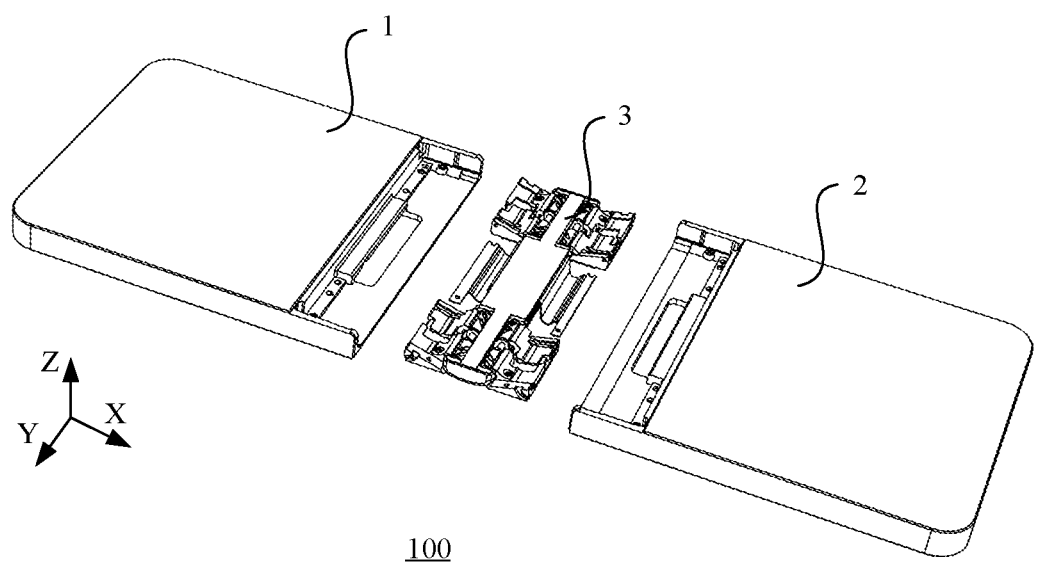
FIG. 3 is a schematic exploded view of main components of the foldable screen device in FIG. 1.

FIG. 3 is a schematic exploded view of main components of the foldable screen device in FIG. 1. As shown in FIG. 3, a physical folded structure of the foldable screen device mainly includes a first frame 1, a second frame 2, and a rotating shaft assembly 3 connected between the first frame 1 and the second frame 2. One end that is of each of the two frames and that is connected to the rotating shaft assembly 3 serves as an articulated end, and one end that is of the frame and that is away from the rotating shaft assembly 3 serves as a free end. The free ends of the two frames may rotate around the rotating shaft assembly 3, so that an overall structure of the foldable screen device is in an opened or closed state.

Figure 4:
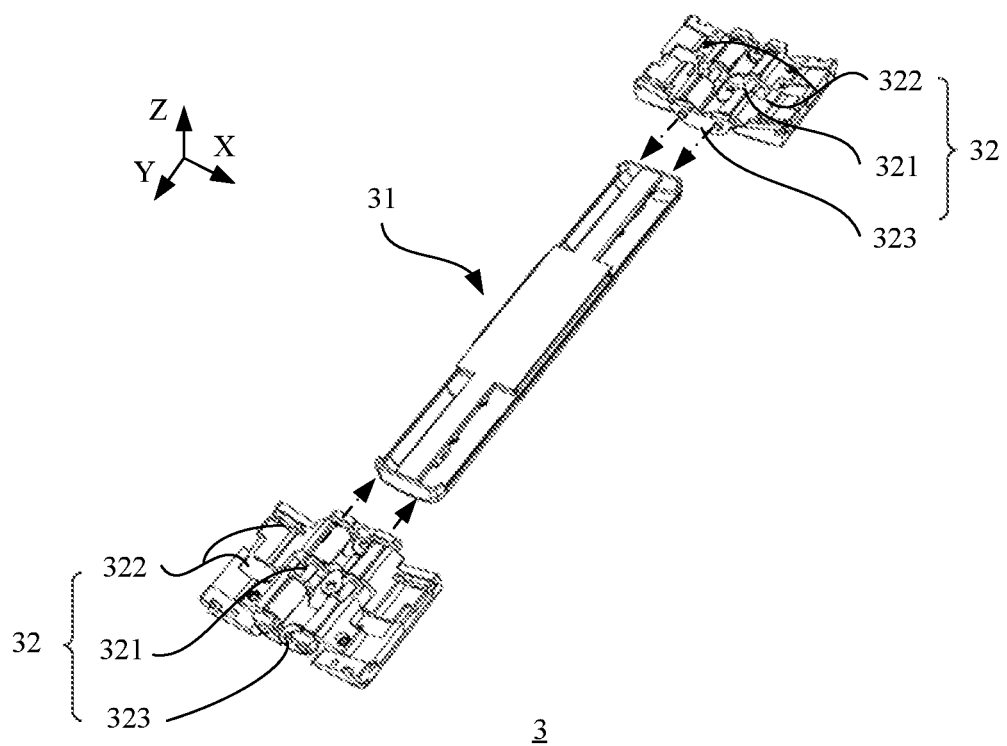
FIG. 4 is a schematic exploded view of a rotating shaft assembly of a foldable screen device according to this application.

In one embodiment, FIG. 4 is a schematic exploded view of the rotating shaft assembly of the foldable screen device according to this application. The rotating shaft assembly shown in FIG. 4 includes a connection structure 31 and two hinges 32 connected to the connection structure 31. Each hinge 32 includes two rotating shafts 321 disposed in parallel and a plurality of articulated arms 322 correspondingly connected to the rotating shafts 321. One end of the articulated arm 322 is articulated to the rotating shaft, and the other end of the articulated arm 322 is configured to be fixedly connected to a corresponding frame. Driven by the connections of the articulated arms 322, the first frame 1 and the second frame 2 may respectively rotate around the corresponding rotating shafts 321. In this way, the two rotating shafts 321 are disposed in parallel, and different frames are correspondingly connected to different rotating shafts 321, so that the two frames of the foldable screen device can be folded and unfolded at relatively large angles.

To implement a connection between and positioning of the hinge 32 and the connection structure 31, the hinge 32 further includes a support 323. The support 323 supports and is disposed between the connection structure 31 and the rotating shaft 321, and the rotating shaft 321 can freely rotate relative to the support 323. For example, the support 323 may be in a form of a support rib. In addition, an overall structure of the rotating shaft assembly 3 may further have a plurality of different shapes and types. For a shape of the rotating shaft assembly 3, refer to a rotating shaft support structure commonly used by a person skilled in the art. Details are not described herein.

Figure 5A:
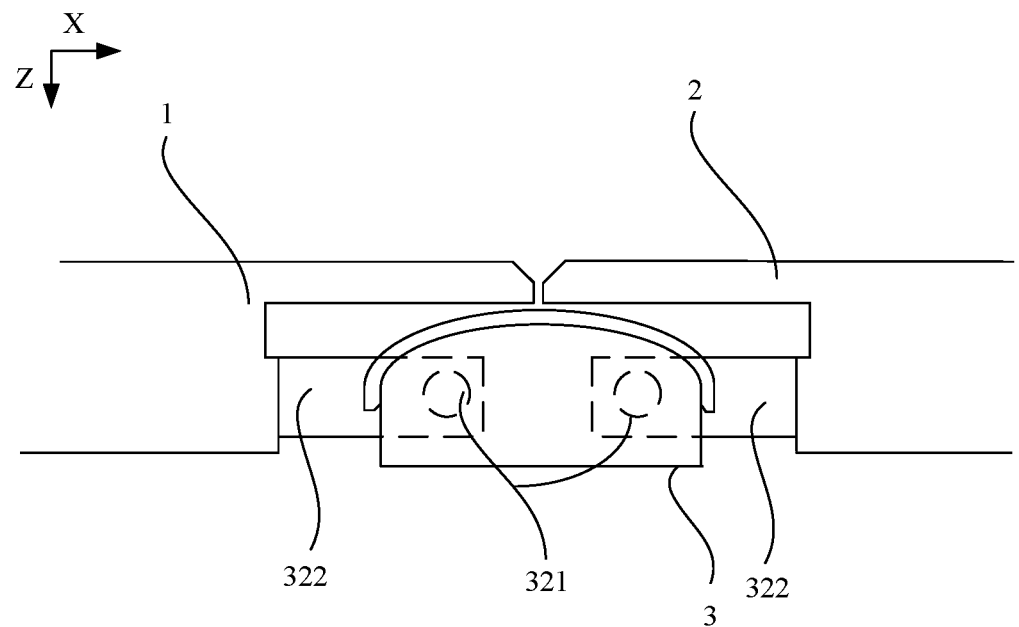
FIG. 5a is a schematic diagram of a position of a rotating shaft assembly when the foldable screen device in FIG. 1 is in an unfolded state.
Figure 5B:
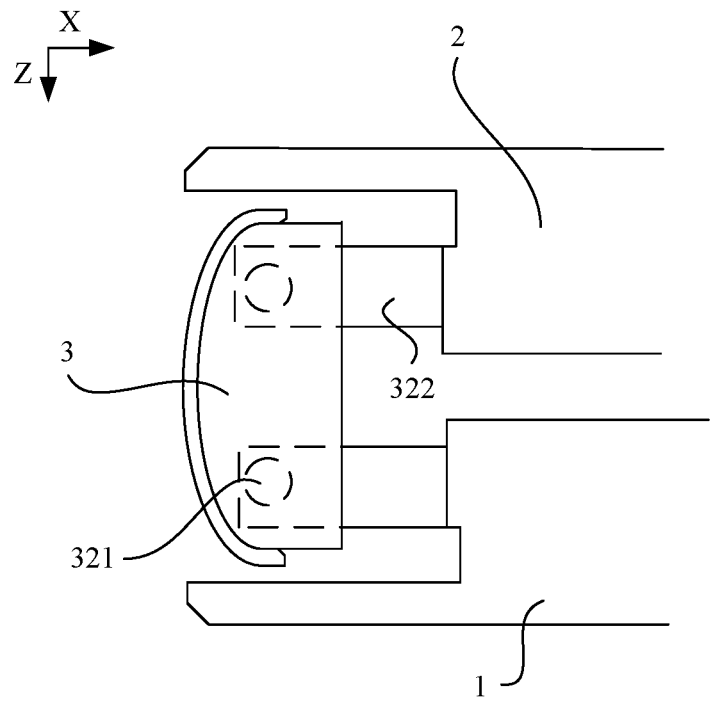
FIG. 5b is a schematic diagram of a position of a rotating shaft assembly when the foldable screen device in FIG. 1 is in a folded state.

FIG. 5a is a schematic diagram of a position of the rotating shaft assembly when the foldable screen device in FIG. 1 is in an unfolded state. FIG. 5b is a schematic diagram of a position of the rotating shaft assembly when the foldable screen device in FIG. 1 is in a folded state. As shown in FIG. 5a and FIG. 5b, it can be easily seen that, when the rotating shaft assembly 3 is connected to the first frame 1 and the second frame 2, and a closing or opening operation is performed, the first frame 1 and the second frame 2 respectively rotate around the two rotating shafts 321 inside the rotating shaft assembly 3. In this case, the overall structure of the rotating shaft assembly 3 does not undergo folding or other deformation, that is, the entire rotating shaft assembly 3 undergoes only a posture change, and does not undergo deformation such as folding. Components other than the rotating shafts 321 inside the rotating shaft assembly 3 do not generate relative rotation or other relative displacement. Therefore, the rotating shaft assembly 3 may serve as a whole, and an internal structure of the rotating shaft assembly 3 is used to assist in positioning and fixing the electrical connection line 4 or another component.

The two hinges 32 in the rotating shaft assembly 3 may be respectively located at two ends of the connection structure 31, and no rotating shaft 321 or another rotatable component is disposed in a middle region of the connection structure 31. Therefore, a static accommodation space may be formed in the middle region of the connection structure 31, and a component fastened by the rotating shaft assembly 3 may pass through and be accommodated in the middle region of the connection structure 31, and is not interfered by a structure such as the rotating shaft 321 during rotation. A person skilled in the art may understand that the static accommodation space formed in the connection structure 31 may also be located at another position of the connection structure 31, for example, in an end region of the connection structure 31. The following mainly uses a connection relationship between the middle region of the connection structure 31 in the rotating shaft assembly 3 and another component as an example for description. Unless otherwise specified, unrelated structures such as the articulated arms in the rotating shaft assembly 3 are omitted.

Figure 6:
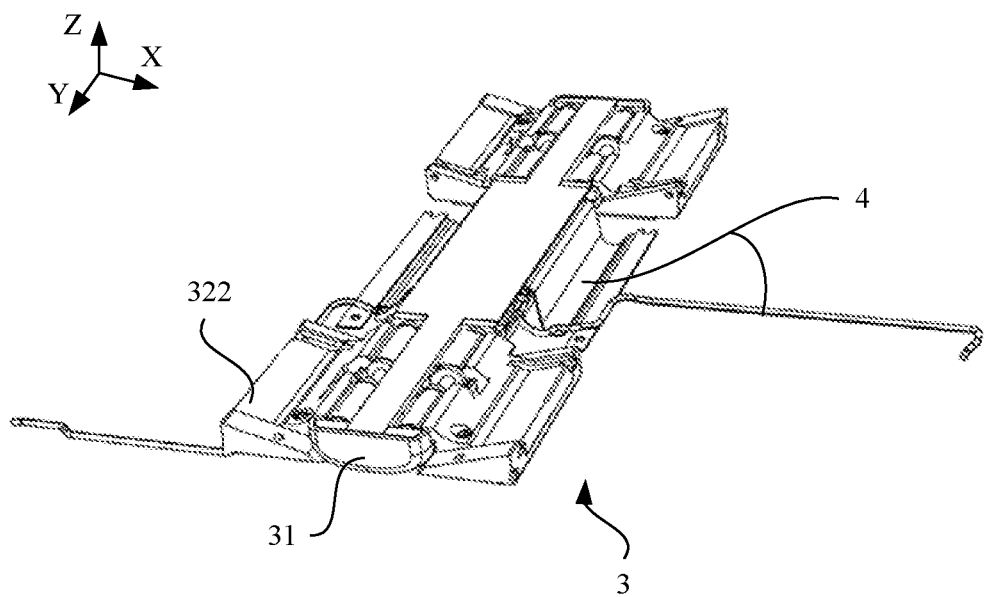
FIG. 6 is a schematic diagram of a connection between a rotating shaft assembly and an electrical connection line in a foldable screen device according to an embodiment of this application.

FIG. 6 is a schematic diagram of a connection between the rotating shaft assembly and the electrical connection line in the foldable screen device according to this embodiment of this application. As shown in FIG. 6, to implement an electrical connection between primary circuit boards or flexible screens located in different frames, the electrical connection line 4 passes through the rotating shaft assembly 3 connected between the two frames. In one embodiment, the electrical connection line 4 passes through the middle region of the connection structure 31 of the rotating shaft assembly 3, and two ends of the electrical connection line 4 are respectively connected and coupled to electrical connection points of the different frames, to implement conduction and signal transmission with the primary circuit boards, the processors, or other components located in the different frames. It can be known from the foregoing description that a portion that is of the electrical connection line 4 and that is accommodated inside the connection structure 31 is not interfered by the rotating shaft 321 during rotation.

However, to adapt to unfolding or folding of the foldable screen device, the electrical connection line 4 has a relatively long redundant length. When the foldable screen device is opened or closed, the first frame 1 and the second frame 2 rotate, and relative positions of the first frame 1 and the second frame 2 and relative distances between the electrical connection points also change accordingly. To avoid large deformation and position change of the excessively long electrical connection line 4 when the frames rotate, a positioning component for positioning the electrical connection line 4 may be disposed on the connection structure 31 of the rotating shaft assembly 3.

In FIG. 7 to FIG. 16, a connection relationship between the connection structure 31 and the electrical connection line 4 is further described in detail.

Figure 7:
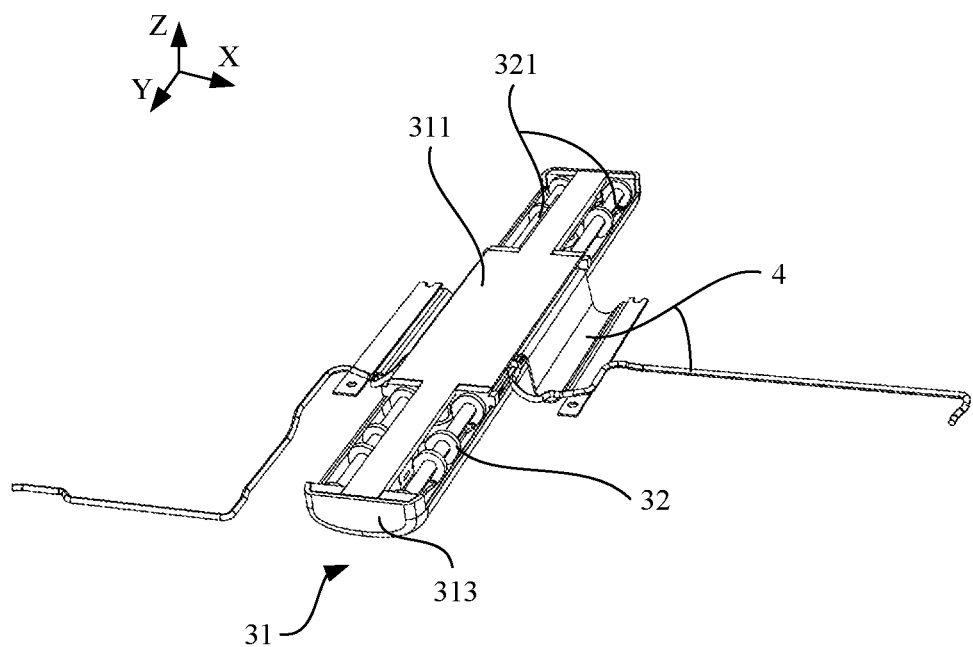
FIG. 7 is a schematic structural diagram of a connection structure in a foldable screen device in a first direction according to an embodiment of this application.
Figure 8:
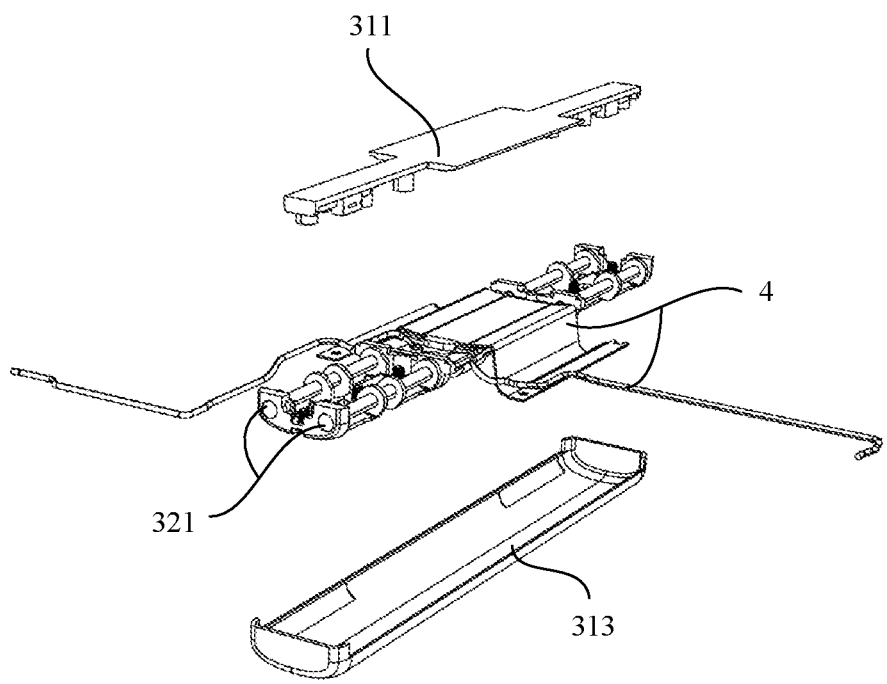
FIG. 8 is a schematic exploded view of the connection structure in FIG. 7.
Figure 9:
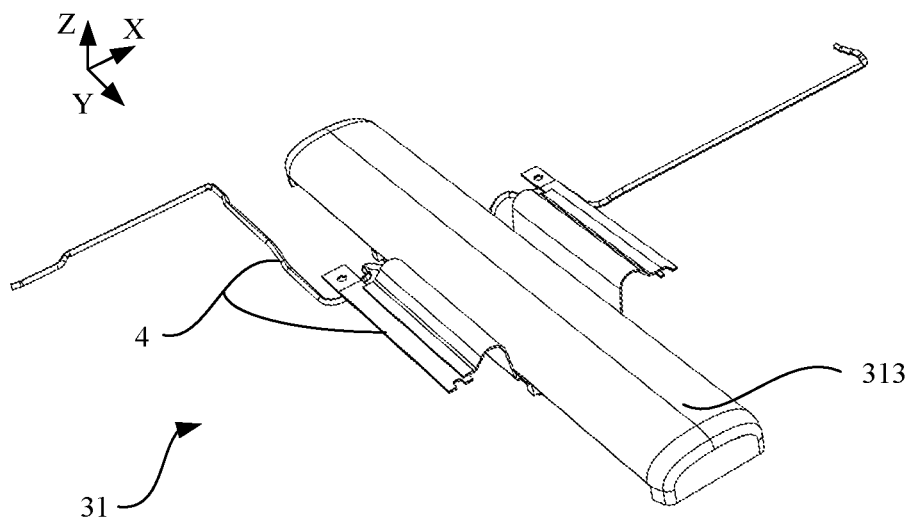
FIG. 9 is a schematic structural diagram of a connection structure in a foldable screen device in a second direction according to an embodiment of this application.
Figure 10:
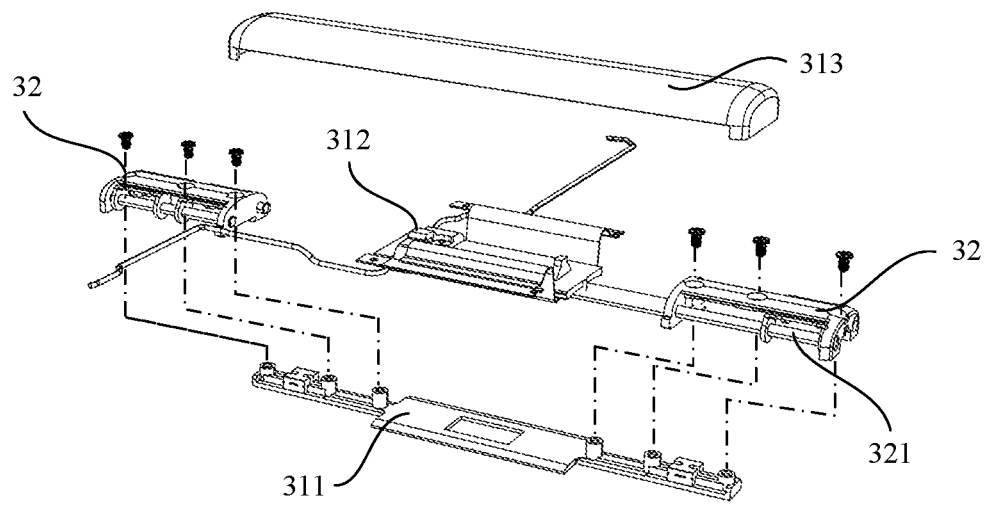
FIG. 10 is a schematic exploded view of the connection structure in FIG. 9.

FIG. 7 is a schematic structural diagram of the connection structure in the foldable screen device in a first direction according to this embodiment of this application. FIG. 8 is a schematic exploded view of the connection structure in FIG. 7. FIG. 9 is a schematic structural diagram of the connection structure in the foldable screen device in a second direction according to this embodiment of this application. FIG. 10 is a schematic exploded view of the connection structure in FIG. 9. In FIG. 7 to FIG. 10, a general structure of the connection structure 31 in the rotating shaft assembly 3 is first described. In one embodiment, as shown in FIG. 7 to FIG. 10, the connection structure 31 in the rotating shaft assembly 3 may include components such as a first shaft cover 311, a second shaft cover 313, and a positioning piece 312. The first shaft cover 311 and the second shaft cover 313 each are close to the articulated ends of the frames, and are clamped between the two frames. The first shaft cover 311 and the second shaft cover 313 are directly connected or indirectly connected by using another component, and the first shaft cover 311 and the second shaft cover 313 are relatively fastened. Two opposite sides of each of the first shaft cover 311 and the second shaft cover 313 are respectively connected to the two frames. The first direction and the second direction are two opposite directions. For example, the first direction is an inside-out direction of the rotating shaft assembly 3, and the second direction is an outside-in direction of the rotating shaft assembly 3.

It can be known from the foregoing that the first shaft cover 311 and the second shaft cover 313 in the rotating shaft assembly 3 have determined relative positions. Therefore, the first shaft cover 311 and the second shaft cover 313 may be used together to install and fasten the positioning piece 312.

In one embodiment, both the first shaft cover 311 and the second shaft cover 313 may be thin shell-shaped or thin plate-shaped components, and may be disposed in approximately parallel to each other. For example, in this embodiment, both the first shaft cover 311 and the second shaft cover 313 are the plate-shaped components, and plate surface extension directions of the first shaft cover 311 and the second shaft cover 313 are kept parallel to or approximately parallel to the rotating shaft 321. Plate surfaces of the first shaft cover 311 and the second shaft cover 313 may extend to have lengths approximately equal to widths of the frames. In this way, the first shaft cover 311 and the second shaft cover 313 may serve as main components of a positioning structure in the rotating shaft assembly 3, to support other structures of the rotating shaft assembly 3 in a length direction of the entire rotating shaft 321, or may serve as an exterior part of the rotating shaft assembly 3, to shield a gap formed when the two adjacent frames relatively rotate during folding and deformation of the foldable screen device.

The second shaft cover 313 may be disposed on an outer side of the rotating shaft assembly 3, namely, on a side close to the articulated end of the frame; and the first shaft cover 311 may be disposed on an inner side of the rotating shaft assembly 3, namely, on a side that is of the second shaft cover 313 and that faces the free end of the frame. In this case, the first shaft cover 311 is hidden inside the rotating shaft assembly 3. When the frame of the foldable screen device rotates, the second shaft cover 313 is exposed to an outer side of the articulated end of the frame, to form an exterior part of the rotating shaft assembly 3. Correspondingly, when the second shaft cover 313 serves as the exterior part, a cross section of the second shaft cover 313 in a direction perpendicular to the rotating shaft 321 may be an arc, so that a side profile of the foldable screen device is beautiful.

In the rotating shaft assembly 3, there is a particular spacing between the first shaft cover 311 and the second shaft cover 313, to form an accommodation space between the first shaft cover 311 and the second shaft cover 313, and the positioning piece 312 may be disposed in the accommodation space and cooperate with other components of the rotating shaft assembly 3 to position the electrical connection line 4.

The first shaft cover 311 and the second shaft cover 313 jointly form the accommodation space, and the electrical connection line 4 is accommodated inside the accommodation space. Therefore, the electrical connection line 4 is shielded and protected by the first shaft cover 311 and the second shaft cover 313. In this way, structure reliability is relatively high, and appearance is relatively good.

Figure 11:
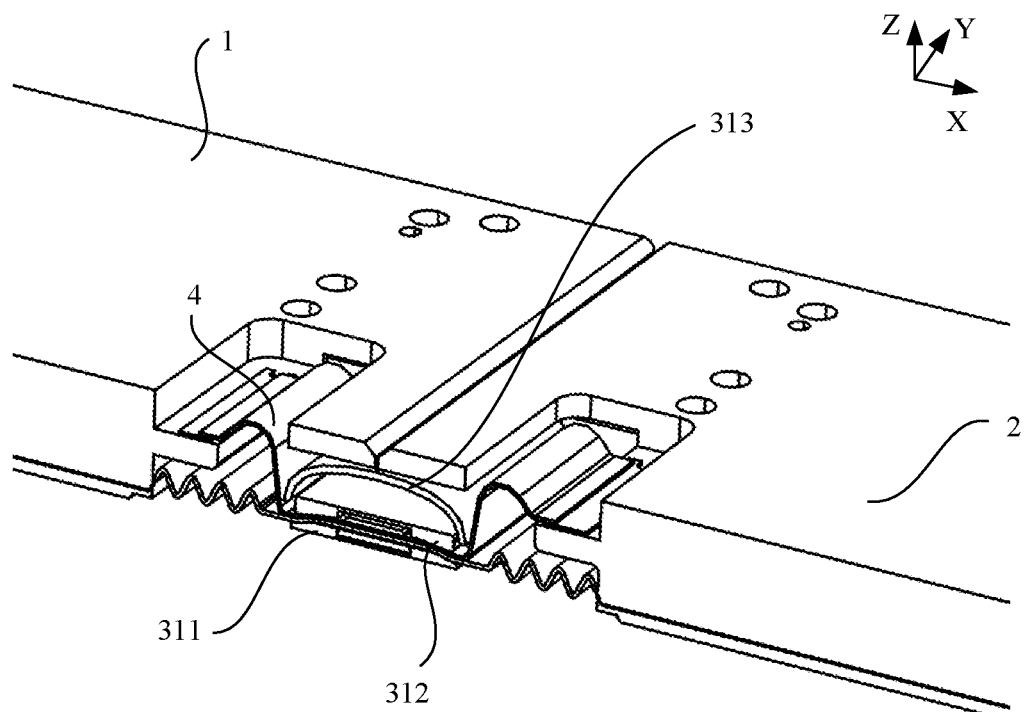
FIG. 11 is a schematic diagram of a partial cross section of a connection structure in a foldable screen device according to an embodiment of this application.

FIG. 11 is a schematic diagram of a partial cross section of the connection structure in the foldable screen device according to this embodiment of this application. As shown in FIG. 11, to position the electrical connection line 4, the positioning piece 312 in the rotating shaft assembly 3 is fastened between the first shaft cover 311 and the second shaft cover 313. The positioning piece 312 and the first shaft cover 311 jointly clamp the electrical connection line 4 between the positioning piece 312 and the first shaft cover 311, and restrict the electrical connection line 4 to some extent. In this case, the positioning piece 312 and the first shaft cover 311 jointly form a positioning point located at the middle segment of the electrical connection line 4. Compared with that in an existing electrical connection line 4 that is connected to frames only depending on two ends and whose middle segment is in a free-bending suspended state, in this application, positions of the middle segment and the end parts of the electrical connection line 4 are all positioned, so that a length of a part that can be freely bent and that is of the electrical connection line 4 is reduced, and correspondingly, a bending deformation amplitude is also reduced. In addition, because the rotating shaft assembly 3 is located between the two frames, the positioning point formed by the rotating shaft assembly 3 also divides, in a length direction, the entire electrical connection line 4 into two segments with similar lengths. The two segments of the electrical connection lines 4 have relatively similar bending deformation amounts, and generate synchronous deformation and displacement. In this way, the electrical connection line 4 positioned with the aid of the rotating shaft assembly 3 generates small bending deformation when the foldable screen device is folded, and a bending amount is prone to control. Therefore, connection reliability is high.

When the first shaft cover 311 is fixed relative to the positioning piece 312, the positioning piece 312 may be fixedly connected only to the first shaft cover 311, or the first shaft cover 311 and the second shaft cover 313 may jointly fasten the positioning piece 312. The positioning piece 312 may have different structures according to different connection manners. In this embodiment, an example in which the first shaft cover 311 and the second shaft cover 313 jointly fasten the positioning piece 312 is used to describe manners of fastening and connecting the positioning piece 312 in the rotating shaft assembly 3.

Figure 12:
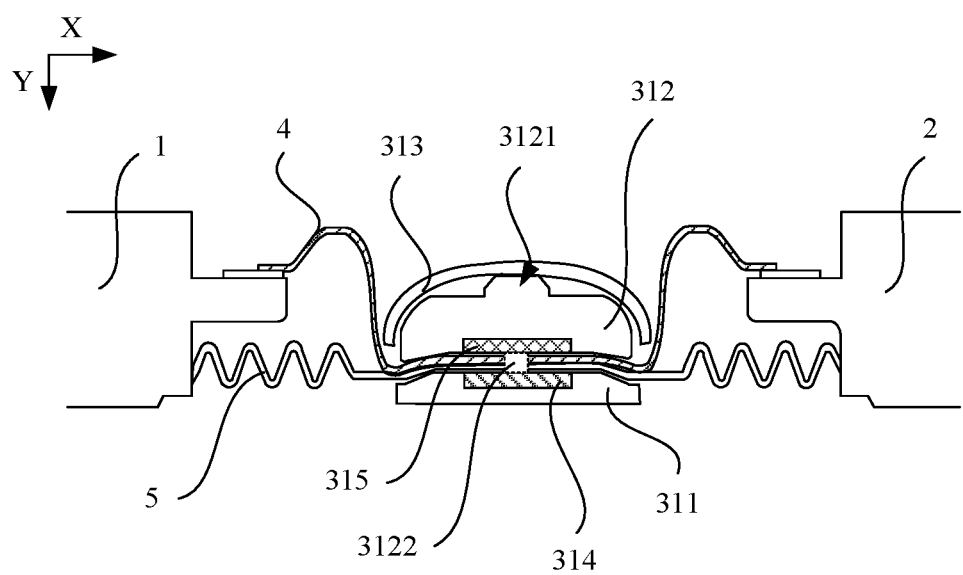
FIG. 12 is a schematic diagram of a cross section of a connection structure in a foldable screen device according to an embodiment of this application.
Figure 13:
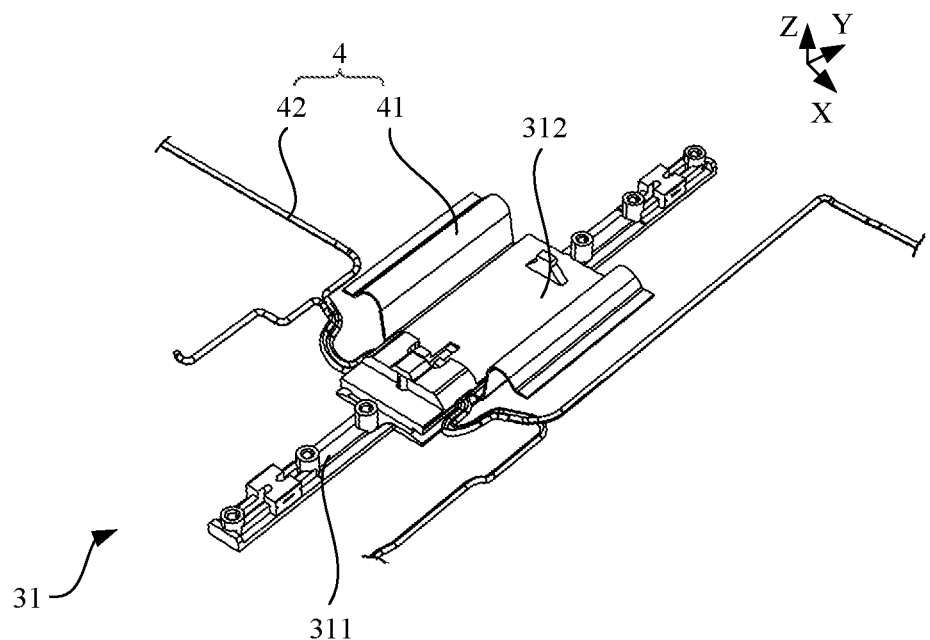
FIG. 13 is a schematic structural diagram of a connection structure in a foldable screen device according to an embodiment of this application.

FIG. 12 is a schematic diagram of a cross section of the connection structure in the foldable screen device according to this embodiment of this application. FIG. 13 is a schematic structural diagram of the connection structure in the foldable screen device according to this embodiment of this application. As shown in FIG. 12 and FIG. 13, the first shaft cover 311 and the second shaft cover 313 jointly form an accommodation space, and the positioning piece 312 may be installed in the accommodation space. A structure on one side of the positioning piece 312 is installed on a surface that is of the first shaft cover 311 and that faces the second shaft cover 313, and a structure on the other side of the positioning piece 312 may press against an inner surface of the second shaft cover 313. The electrical connection line 4 is clamped between the positioning piece 312 and the first shaft cover 311. In FIG. 13, to facilitate observation of the connection structure 31, the second shaft cover 313 is hidden. A person skilled in the art may clearly know a position and a connection relationship of the second shaft cover 313 relative to another component of the connection structure 31 with reference to other accompanying drawings.

Figure 14:
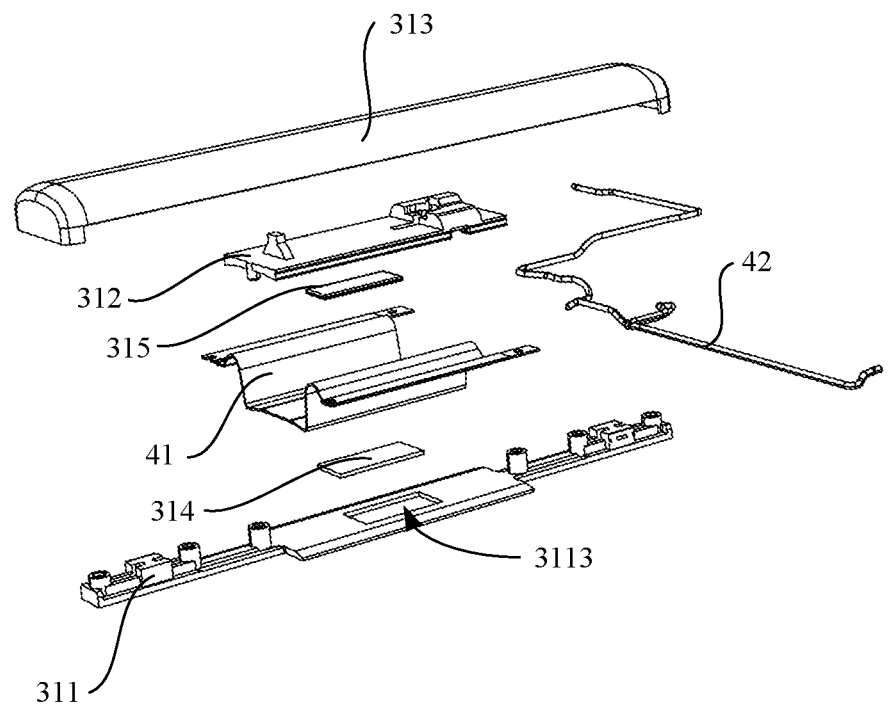
FIG. 14 is a schematic exploded view of the connection structure in FIG. 13.
Figure 15:
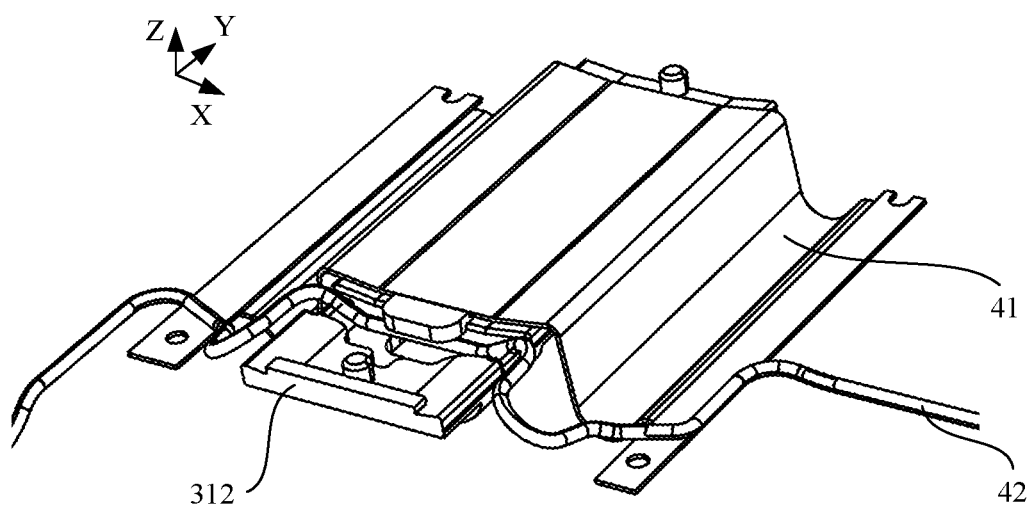
FIG. 15 is a schematic structural diagram of a connection structure in a foldable screen device in another direction according to an embodiment of this application.
Figure 16:
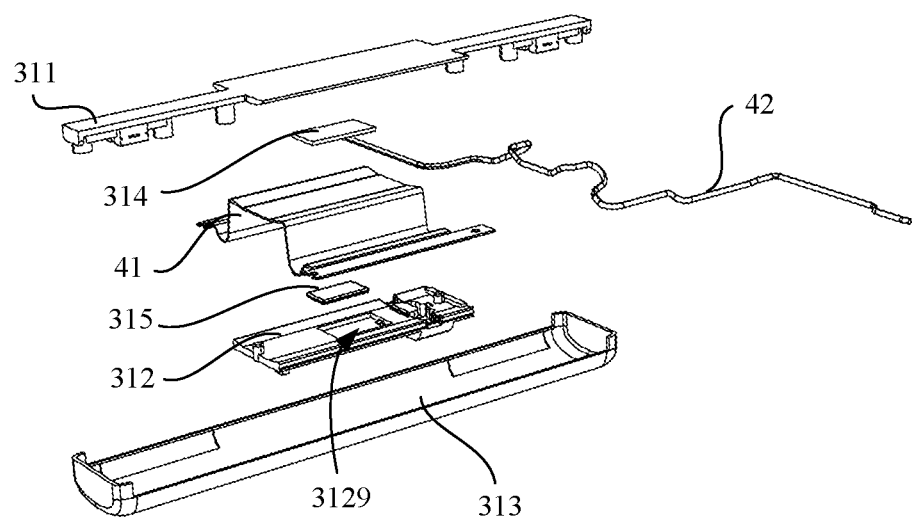
FIG. 16 is a schematic exploded view of the connection structure in FIG. 15.

When the connection structure 31 in the rotating shaft assembly 3 is configured to position the electrical connection line 4, a position relationship between the connection structure 31 and the electrical connection line 4 may be shown in FIG. 13 to FIG. 16. FIG. 14 is a schematic exploded view of the connection structure in FIG. 13. FIG. 15 is a schematic structural diagram of the connection structure in the foldable screen device in another direction according to this embodiment of this application. FIG. 16 is a schematic exploded view of the connection structure in FIG. 15. Similar to FIG. 13, to facilitate observation of the connection structure 31, the first shaft cover 311 and the second shaft cover 313 are hidden in FIG. 15. A person skilled in the art may clearly know positions and connection relationships of the first shaft cover 311 and the second shaft cover 313 relative to other components of the connection structure 31 with reference to other accompanying drawings.

As shown in FIG. 14 to FIG. 16, the electrical connection line 4 including a flexible printed circuit board 41, a cable 42 and the like is located between the positioning piece 312 and the first shaft cover 311, and the positioning piece 312 is located between the first shaft cover 311 and the second shaft cover 313. Mutual matching structures and connection manners between the positioning piece 312, the first shaft cover 311, and the second shaft cover 313 have been described in detail in the foregoing embodiments, and details are not described herein again.

It should be noted that, when the positioning piece 312 and the first shaft cover 311 jointly position the electrical connection line 4, the positioning piece 312 and the first shaft cover 311 do not need to clamp two opposite sides of the electrical connection line 4, but only need to jointly define a space for positioning the electrical connection line 4, to limit the electrical connection line 4 in the space. In this case, a channel through which the electrical connection line 4 can pass is actually formed between the positioning piece 312 and the first shaft cover 311. The channel has two opposite side channel walls formed by the positioning piece 312 and the first shaft cover 311 respectively, and two ends of the channel are respectively connected to space inside the two frames. Therefore, the electrical connection line 4 can enter the channel from one of the frames, and extend to the other frame through the channel. When a part that is of the electrical connection line 4 and that is located between the positioning piece 312 and the first shaft cover 311 tends to bend and deform, the part is limited by the channel walls, that is, the part is limited only in a region inside the channel, and cannot be greatly bent out of the channel.

In this case, the positioning piece 312 and the first shaft cover 311 clamp the electrical connection line 4 in a Z-axis direction. Therefore, a clamped part of the electrical connection line 4 is constrained in the Z-axis direction, and a large amplitude of bending displacement cannot be generated. Constrained by the positioning piece 312 and end parts of the electrical connection line 4, a bending deformation amplitude of a part that is of the electrical connection line 4 and that is not clamped by the positioning piece 312 is also largely reduced, and overall displacement and a deformation amount of the electrical connection line 4 are controlled.

It may be understood that, because the connection structure 31 and components such as the hinges 32 in the rotating shaft assembly 3 are located at different positions in an axial direction of the rotating shaft 321, the channel formed by the connection structure 31 and components such as the hinges 32 used to be connected to the frames may also be located at different positions in the axial direction of the rotating shaft 321. In this way, when structures such as the articulated arm 322 in the hinge 32 drives the frame to rotate around the rotating shaft 321, components such as the positioning piece 312 and the first shaft cover 311 that form the channel still have relatively static positions, the channel does not deform or change in another state due to rotation of the rotating shaft 321, and a structure of the channel is relatively stable and reliable.

To further assist in fastening the electrical connection line 4 and reduce installation difficulty between the positioning piece 312 and the electrical connection line 4, the electrical connection line 4 may be pre-positioned on the rotating shaft assembly 3 by using an attraction force between magnetic pieces or other pieces that can be attracted with each other.

Specifically, it can be known from the foregoing content that the first shaft cover 311 and the positioning piece 312 in the rotating shaft assembly 3 jointly clamp and position the electrical connection line 4, and therefore, a first magnetic piece 314 and a second magnetic piece 315 that can be attracted with each other may be disposed. At least one of the first magnetic piece 314 and the second magnetic piece 315 is relatively fastened to the entire rotating shaft assembly 3. The first magnetic piece 314 and the second magnetic piece 315 are located on the two opposite sides of the electrical connection line 4. In this way, the electrical connection line 4 is pre-positioned on the rotating shaft assembly 3 by using the mutual attraction force of the first magnetic piece 314 and the second magnetic piece 315.

The first magnetic piece 314 and the second magnetic piece 315 may be made of a permanent magnetic material or a soft magnetic material. In one embodiment, one of the first magnetic piece 314 and the second magnetic piece 315 may be a magnet, and the other may be a soft magnet. For example, the first magnetic piece 314 is a magnet, and the second magnetic piece 315 is a soft magnet; or the first magnetic piece 314 is a soft magnet, and the second magnetic piece 315 is a magnet. Alternatively, in one embodiment, both the first magnetic piece 314 and the second magnetic piece 315 may be magnets, and the first magnetic piece 314 and the second magnetic piece 315 have opposite polarities. The soft magnet may be a magnetizable iron part, a steel part, or the like.

When the first magnetic piece 314 and the second magnetic piece 315 are configured to assist in positioning the electrical connection line 4, the first magnetic piece 314 and the second magnetic piece 315 may have a plurality of different installation positions. When the rotating shaft assembly 3 is assembled, the first shaft cover 311 and another main body structure of the rotating shaft assembly 3 need to be assembled and serve as an installation reference, and then structures such as the electrical connection line 4, the positioning piece 312, and the second shaft cover 313 are installed in sequence. Therefore, the first magnetic piece 314 or the second magnetic piece 315 is installed on the first shaft cover 311.

In one embodiment, the first magnetic piece 314 may be disposed on the first shaft cover 311, and the second magnetic piece 315 is located on the positioning piece 312. Because the positioning piece 312 and the first shaft cover 311 are located on different sides of the electrical connection line 4, the positioning piece 312 and the first shaft cover 311 can directly clamp the electrical connection line 4 by using a magnetic force, provided that the positioning piece 312 and the first shaft cover 311 are close to each other, to complete pre-positioning of components such as the electrical connection line 4 and the positioning piece 312. After assembly of the electrical connection line 4 and the positioning piece 312 is completed, the first magnetic piece 314 and the second magnetic piece 315 may also depend on the mutually attracted magnetic force, to generate, between the positioning piece 312 and the first shaft cover 311, torques that are close to each other, to assist in positioning the electrical connection line 4.

However, because a part of the electrical connection line 4 may exist in a form of a flat cable and has a relatively large width and a relatively large coverage area, in one embodiment, the electrical connection lines 4 may be used to carry the magnetic pieces. In one embodiment, the first magnetic piece 314 may be disposed on the first shaft cover 311, and the second magnetic piece 315 is disposed on the electrical connection line 4. In this way, the second magnetic piece 315 and the first magnetic piece 314 may be attracted with each other, and are positioned on the first shaft cover 311 together with the electrical connection line 4. In this installation manner, the electrical connection line 4 can be pre-positioned on the first shaft cover 311 without participation of the positioning piece 312.

In this installation manner, the second magnetic piece 315 may be disposed on the electrical connection line 4 in a plurality of manners. In one embodiment, the second magnetic piece 315 may be disposed on a plate surface of the electrical connection line 4 in a bonding manner or the like, to be integrated with the electrical connection line 4; or a bearing structure that can carry the second magnetic piece 315 is disposed on the electrical connection line 4, and the second magnetic piece 315 is installed in the bearing structure, to implement relative positioning of the electrical connection line 4 and the second magnetic piece 315.

It should be noted that, in the foregoing installation manners, because the first magnetic piece 314 and the second magnetic piece 315 can be attracted with each other without being in contact with each other, the first magnetic piece 314 and the second magnetic piece 315 may be disposed at different positions on the first shaft cover 311, the positioning piece 312, and the electrical connection line 4, provided that the first magnetic piece 314 and the second magnetic piece 315 have relative positions and the positioning piece 312 and the first shaft cover 311 can be close to each other by using a magnetic force between the first magnetic piece 314 and the second magnetic piece 315. In addition, for ease of installation, the first magnetic piece 314 and the second magnetic piece 315 may have relatively regular shapes. For example, both the first magnetic piece 314 and the second magnetic piece 315 may be in a shape of a cuboid.

In addition, the first magnetic piece 314 and the first shaft cover 311, or the second magnetic piece 315 and the positioning piece 312 may alternatively form an integrated structure. In this case, the connection structure 31 actually includes only the first magnetic piece 314 or only the second magnetic piece 315. Correspondingly, the entire positioning piece 312 or the entire first shaft cover 311 is made of a soft magnet. For example, the first magnetic piece 314 is disposed on the first shaft cover 311, the first magnetic piece 314 is a magnet, and the entire positioning piece 312 is a soft magnet that can be attracted by the magnet. Alternatively, the second magnetic piece 315 is disposed on the positioning piece 312, the second magnetic piece 315 is a magnet, and the first shaft cover 311 is made of a soft magnet. In this way, a structure of the first shaft cover 311 or the positioning piece 312 can be simplified, and manufacturing difficulty can be reduced.

In this way, by using the magnetic force of the magnetic pieces, the electrical connection line 4 may be disposed on an assembly component in advance in an assembly process of the rotating shaft assembly 3, to prevent the electrical connection line 4 from being detached from an assembly position due to external pulling or other forces, and effectively reduce assembly difficulty. In addition, by using an attraction function of the magnetic pieces, the first shaft cover 311 and the positioning piece 312 can clamp tightly, or the electrical connection line 4 can be attached to the first shaft cover 311, to assist in positioning the electrical connection line 4.

Figure 17:
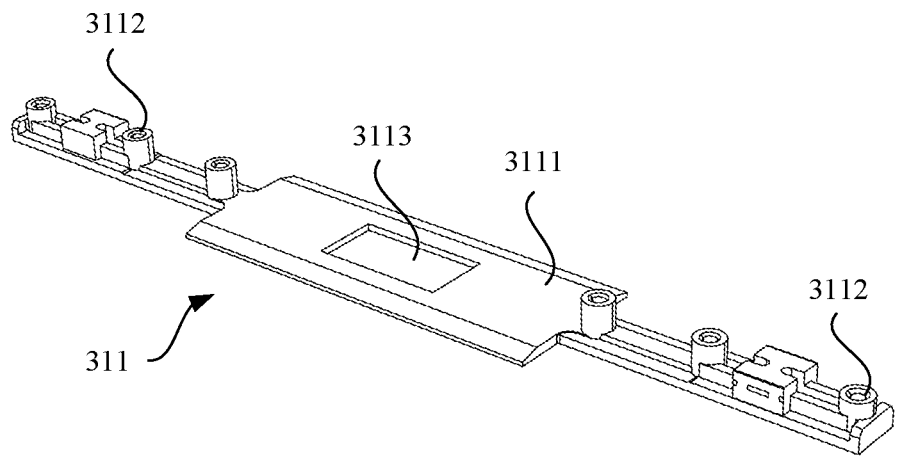
FIG. 17 is a schematic diagram of a structure of a first shaft cover in a foldable screen device according to an embodiment of this application.

To complete connection between components inside the connection structure, in addition to the magnetic piece, there is also a structure that can be relatively matched between the components. FIG. 17 is a schematic diagram of a structure of the first shaft cover in the foldable screen device according to this embodiment of this application. As shown in FIG. 17, the first shaft cover 311 may occupy an entire length direction of the rotating shaft assembly 3, to serve as a connection basis between the connection structure 31 and the hinge 32. The positioning piece 312 and the second shaft cover 313 may be assembled by using the first shaft cover 311 as a positioning and assembly reference. In one embodiment, the first shaft cover 311 includes a first fixing surface 3111 located in the middle region of the first shaft cover 311 and connection rods 3112 located in end regions. The connection rod 3112 may be configured to be connected to the hinge 32 or another structure, and the first fixing surface 3111 may be configured to arrange the positioning piece 312. To enable the rotating shaft assembly 3 to evenly bear a force, the connection rods 3112 are symmetrically distributed in a length direction of the first shaft cover 311.

In addition, to install the first magnetic piece 314 on the first shaft cover 311, a first installation slot 3113 may be provided on the first fixing surface 3111 of the first shaft cover 311. Both a shape and a size of the first installation slot 3113 match those of the first magnetic piece 314, so that the first magnetic piece 314 can be accommodated in the first installation slot 3113. In one embodiment, the first installation slot 3113 may be connected to the first magnetic piece 314 by using a bonding agent or in a manner of interference fit or the like.

Figure 18:
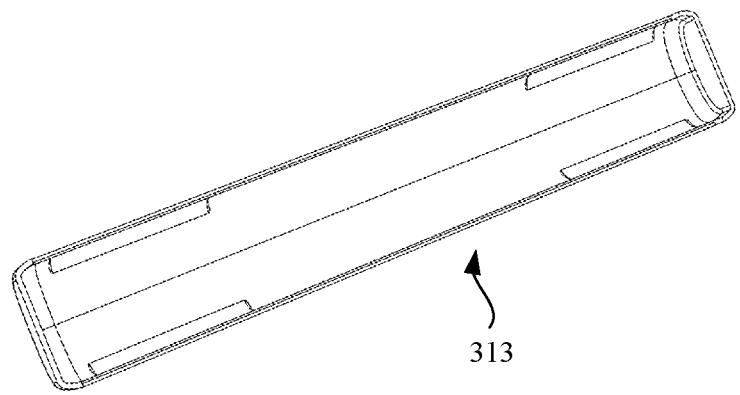
FIG. 18 is a schematic diagram of a structure of a second shaft cover in a foldable screen device according to an embodiment of this application.

FIG. 18 is a schematic diagram of a structure of the second shaft cover in the foldable screen device according to this embodiment of this application. As shown in FIG. 18, the second shaft cover 313 extends in an entire length direction of the rotating shaft assembly 3, which is similar to that of the first shaft cover 311. An inner surface of the second shaft cover 313 is in an arc shape.

Figure 19:
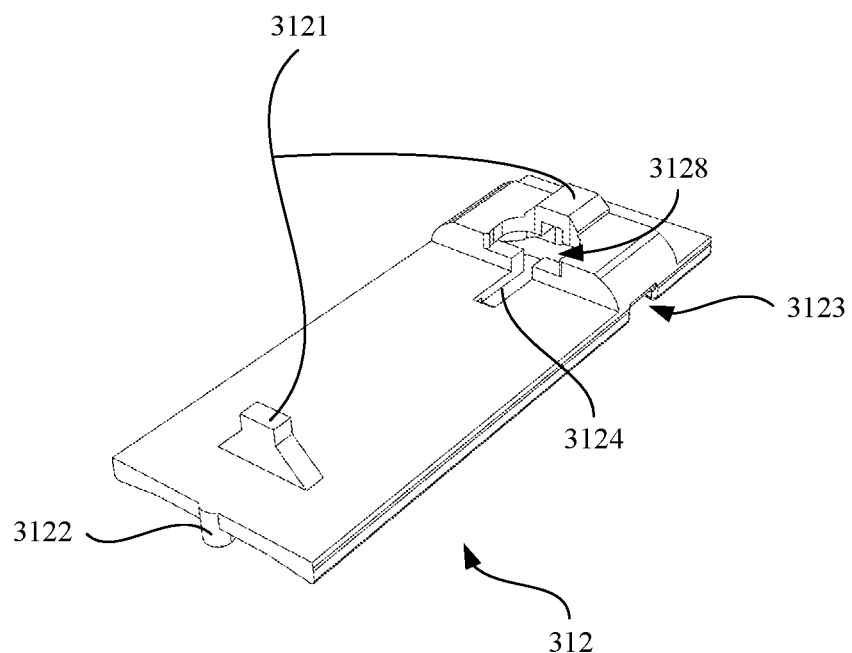
FIG. 19 is a schematic diagram of a front structure of a positioning piece in a foldable screen device according to an embodiment of this application.
Figure 20:
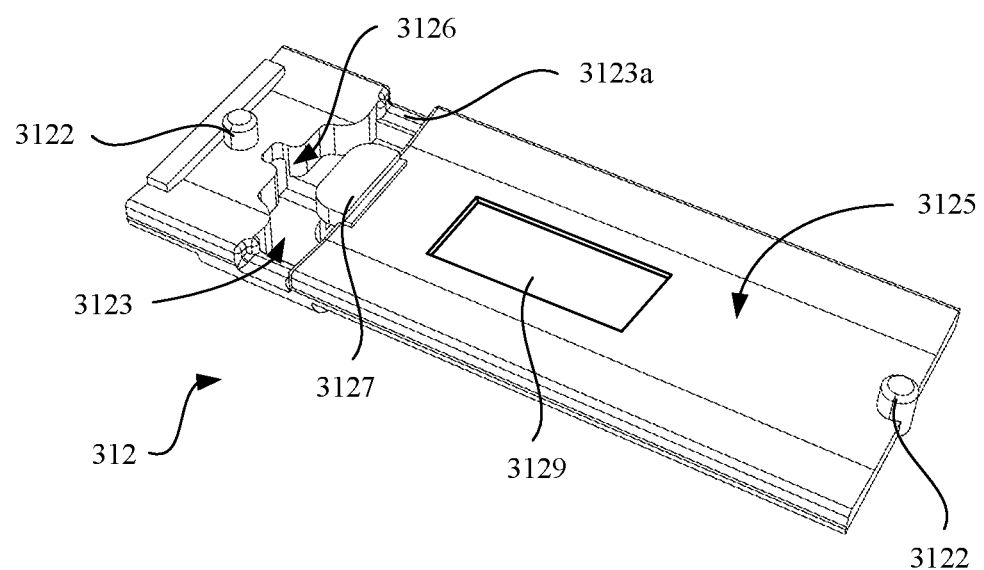
FIG. 20 is a schematic diagram of a back structure of a positioning piece in a terminal device according to an embodiment of this application.

To be connected to the first shaft cover 311 and the second shaft cover 313, the positioning piece 312 has a corresponding matching connection structure. FIG. 19 is a schematic diagram of a front structure of the positioning piece in the foldable screen device according to this embodiment of this application. FIG. 20 is a schematic diagram of a back structure of the positioning piece 312 in a terminal device according to this embodiment of this application. As shown in FIG. 12 to FIG. 20, in one embodiment, a first positioning part 3122 is disposed on a side that is of the positioning piece 312 and that is close to the first shaft cover 311, and the first positioning part 3122 may be connected to the first shaft cover 311, so that the positioning piece 312 and the first shaft cover 311 have fixed relative positions. A second positioning part 3121 is disposed on a side that is of the positioning piece 312 and that is close to the second shaft cover 313, and the second positioning part 3121 may be connected to the second shaft cover 313, so that the positioning piece 312 and the second shaft cover 313 have fixed relative positions.

Because the positioning piece 312 is located between the first shaft cover 311 and the second shaft cover 313, the first shaft cover 311 and the second shaft cover 313 may jointly clamp the positioning piece 312 between the first shaft cover 311 and the second shaft cover 313. In this case, both the first positioning part 3122 and the second positioning part 3121 may have structures such as positioning rods or positioning protrusions, and the first positioning part 3122 and the second positioning part 3121 respectively press against opposite surfaces of the first shaft cover 311 or the second shaft cover 313, so that the positioning piece 312 is firmly clamped between the first shaft cover 311 and the second shaft cover 313.

In one embodiment, as shown in FIG. 19 and FIG. 20, the first positioning part 3122 of the positioning piece 312 protrudes outward from a main body of the positioning piece 312, and a height of the top of the first positioning part 3122 is greater than a height of another part on the side surface of the positioning piece 312. Therefore, when the first positioning part 3122 is connected to the first shaft cover 311, a gap is formed between the main body of the positioning piece 312 and the first shaft cover 311. The gap may be used to allow penetration of the electrical connection line 4.

In the structure of the positioning piece, to enable the positioning piece 312 and the first shaft cover 311 to jointly clamp and position the electrical connection line 4, in one embodiment, a side that is of the main body of the positioning piece 312 and that faces the first shaft cover 311 further has a second fixing surface 3125, and a gap for allowing penetration of the electrical connection line 4 is formed between the second fixing surface 3125 and the first shaft cover 311, so that the electrical connection line 4 can be clamped in a region between the first shaft cover 311 and the second fixing surface 3125. However, a position of a part that is of the electrical connection line 4 and that is clamped by the positioning piece 312 and the first shaft cover 311 is limited, and this part cannot generate a large amplitude of bending and deformation with rotation of the frame.

In this case, because the positioning piece 312 is connected to the first shaft cover 311 by using the first positioning part, the first positioning part protrudes toward the outer side of the second fixing surface 3125 until the first positioning part presses against a corresponding part of the first shaft cover 311. To keep a spacing between each part of the second fixing surface 3125 and the first shaft cover 311, there may be a plurality of first positioning parts 3122 distributed at different positions of the main body of the positioning piece 312. In this embodiment, there are two first positioning parts 3122, and the two first positioning parts 3122 are disposed on two opposite sides of the main body of the positioning piece 312. To reduce impact of the first positioning parts on the second fixing surface 3125 while maintaining the spacing between the second fixing surface 3125 and the first shaft cover 311, there is a relatively large spacing between the plurality of first positioning parts 3122, and the first positioning parts 3122 each may have a relatively small cross-sectional area. In this way, the second fixing surface 3125 may have a relatively large area. The first positioning part 3122 may be in a convex column form.

To be relatively fastened to the second shaft cover 313, the positioning piece 312 further includes a second positioning part 3121. The second positioning part 3121 may be of a structure such as a protrusion, and may press against an inner surface of the second shaft cover 313. In this case, the top of the protrusion may be in an arc shape matching a shape of the inner surface of the second shaft cover 313. In this way, the top of the second positioning part 3121 firmly presses against the inner surface of the second shaft cover 313 and is positioned.

Similar to the first positioning part 3122, there may also be a plurality of second positioning parts 3121, which are distributed at different positions of the positioning piece 312. In this embodiment, there may also be two second positioning parts 3121, and the two second positioning parts 3121 are respectively disposed at two end positions in a length direction of the positioning piece 312. In this way, through connection of the second positioning parts 3121 at different positions, the positioning piece 312 and the second shaft cover 313 can be reliably positioned.

To prevent the electrical connection line 4 from being detached from the region between the positioning piece 312 and the first shaft cover 311, a structure that limits horizontal (namely, a Y-axis direction in the figure) movement of the electrical connection line 4 may be disposed on the positioning piece 312. For example, the positioning piece 312 may limit a transverse position of the electrical connection line 4 by using a structure such as a positioning protrusion. As shown in FIG. 20, as one embodiment structure, a third positioning part 3127 may be disposed on the main body of the positioning piece 312. When the electrical connection line 4 is disposed between the positioning piece 312 and the first shaft cover 311, the third positioning part 3127 is located on a side of the electrical connection line 4, to prevent the electrical connection line 4 from moving toward the third positioning part 3127 on the side of the electrical connection line 4.

The third positioning part 3127 may be of a structure such as a protrusion protruding from the second fixing surface 3125. In this way, the electrical connection line 4 is constrained by a side wall of the third positioning part 3127, and therefore, movement in a direction parallel to the second fixing surface 3125 (a Y-axis direction in the figure) is blocked. There may be one or a plurality of third positioning parts 3127. For example, there may be two third positioning parts 3127, and the two third positioning parts 3127 are disposed on different sides of the electrical connection line 4, to respectively constrain movements of the electrical connection line 4 in directions in which the two third positioning parts 3127 are located. In addition, because a main body of the positioning piece 312 needs to be connected to the first shaft cover 311 by using the first positioning part 3122, the third positioning parts 3127 may cooperate with the first positioning part 3122 to perform horizontal positioning on the electrical connection line 4. In this case, provided that the third positioning parts 3127 are located on one side of the electrical connection line 4, and the other side of the electrical connection line 4 is the first positioning part 3122, the first positioning part 3122 and the third positioning parts 3127 can jointly constrain a transverse position of the electrical connection line 4.

To improve a limiting effect of the third positioning part 3127, the third positioning part 3127 may extend in a length direction of the electrical connection line 4, to position different parts of the electrical connection line 4 in the length direction.

In addition, it may be understood that, to fasten a magnetic piece to the positioning piece 312, the positioning piece 312 is provided with a second installation slot 3129. Both a size and a shape of the second installation slot 3129 match those of the second magnetic piece 315, so that the second magnetic piece 315 is fastened to the positioning piece 312. In one embodiment, the second installation slot 3129 may be located on a surface that is of the positioning piece 312 and that faces the first shaft cover 311, namely, the second fixing surface 3125. In addition, the second magnetic piece 315 may be connected to the second installation slot 3129 through bonding or in a manner of interference fitting or the like.

In addition, the first shaft cover 311 or the second shaft cover 313 may have a structure matching the positioning piece 312. For example, on one or two of the first shaft cover 311 and the second shaft cover 313, a structure whose shape matches a shape of the first positioning part 3122 or the second positioning part 3121 may be disposed, for example, a groove or a positioning hole (not shown in the figure). In this way, the first positioning part or the second positioning part may be inserted into the groove or the positioning hole, to complete fastening of the positioning piece 312 relative to the first shaft cover 311 and the second shaft cover 313.

In addition, it may be understood that, in one embodiment, the positioning piece 312 may alternatively be connected and fastened only to the first shaft cover 311. In this case, the positioning piece 312 may be connected to the first shaft cover 311 in a manner such as a clamping manner.

A person skilled in the art easily understands that, in addition to manners such as clamping and abutting, the positioning piece 312 may also be connected and fastened to the first shaft cover 311, the second shaft cover 313, or another structure of the rotating shaft assembly 3 by using a threaded fastener or in a manner such as a bonding manner. Other connection manners of the positioning piece 312 in the connection structure 31 are not described herein.

When the foldable screen device is folded, with relative rotation of the two frames, the electrical connection line 4 may also move in a length direction of the electrical connection line 4, that is, the electrical connection line 4 slides relative to the positioning piece 312 in an X-axis direction. In this way, a relatively large length difference may exist between lengths of parts that are of the electrical connection line 4 and that are located on two sides of the positioning piece 312, and a relatively long part may still generate a large amplitude of bending deformation. To reduce or avoid sliding of the electrical connection line 4 relative to the positioning piece 312 in the length direction, a corresponding limiting structure may be disposed on the positioning piece 312.

When the limiting structure of the positioning piece 312 limits the sliding of the electrical connection line 4, in one embodiment, different parts or segments of the electrical connection line 4 may have different extension directions by using a bending and deformation feature of the electrical connection line 4 through limiting and guiding the limiting structure. When the electrical connection line 4 is affected by an external force to generate a moving trend in the length direction of the electrical connection line 4, a length direction of each part of the electrical connection line 4 extending in different directions is inconsistent with a direction of the external force. In this way, a particular friction force and resistance are correspondingly generated between the electrical connection line 4 and another structure on the side with the external force, so that the external force for driving the electrical connection line 4 to move is increased, and the moving trend of the electrical connection line 4 in the length direction is slowed down or even eliminated.

The electrical connection line 4 may include a plurality of different types such as a flexible printed circuit board 41 and a single cable 42. For different types of electrical connection lines 4, different limiting structures may be used on the positioning piece 312 to position the electrical connection line 4. The following separately describes in detail limiting structures of the positioning piece 312 by using examples in which the limiting structures position the flexible printed circuit board 41 and the single cable 42.

When the limiting structure positions the flexible printed circuit board 41, the entire flexible printed circuit board 41 is of a bendable thin board structure, has a relatively large width and length, but has a relatively small size in a thickness direction of the flexible printed circuit board 41, namely, a direction perpendicular to a board surface direction of the flexible printed circuit board 41. Therefore, to reduce a size of the limiting structure, when the limiting structure of the positioning piece 312 further limits the flexible printed circuit board 41, the limiting structure of the positioning piece 312 may limit and fasten the flexible printed circuit board 41 in the direction perpendicular to the board surface direction of the flexible printed circuit board 41.

In one embodiment, the limiting structure of the positioning piece 312 may be located on one side of a board surface of the flexible printed circuit board 41, so that the flexible printed circuit board 41 is bent to some extent, and a bending direction is perpendicular to the board surface direction of the flexible printed circuit board 41. When the flexible printed circuit board 41 has a bent part perpendicular to the board surface direction, an extension direction of the bent part of the flexible printed circuit board 41 is different from an entire length direction of the flexible printed circuit board 41. Therefore, the limiting structure located outside the flexible printed circuit board 41 prevents the flexible printed circuit board 41 from moving in the entire length direction of the flexible printed circuit board 41, so that the electrical connection line 4 is limited to an original position.

Figure 21:
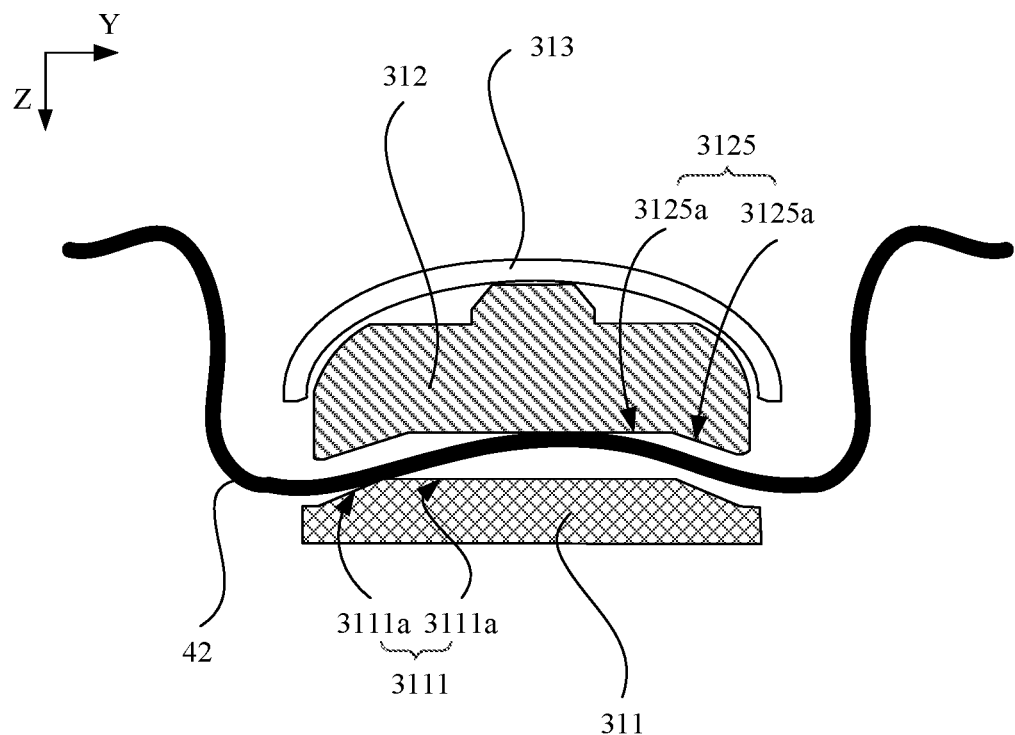
FIG. 21 is a schematic diagram of a connection between a connection structure and a flexible printed circuit board in a foldable screen device according to an embodiment of this application.

FIG. 21 is a schematic diagram of a connection between the connection structure and the flexible printed circuit board in the foldable screen device according to this embodiment of this application. As shown in FIG. 21, in one embodiment, both the first fixing surface 3111 of the first shaft cover 311 and the second fixing surface 3125 of the positioning piece 312 may be concave-convex surfaces, and concave and convex directions of the concave-convex surfaces face a thickness direction of the flexible printed circuit board 41. Because the positioning piece 312 and the first shaft cover 311 jointly clamp the flexible printed circuit board 41 between the positioning piece 312 and the first shaft cover 311, the board surface of the flexible printed circuit board 41 presents a shape matching shapes of the first fixing surface 3111 and the second fixing surface 3125, that is, the plate surface is also bent toward the thickness direction of the flexible printed circuit board 41 to form protrusions or recesses. In this way, the positioning piece 312 can fasten the flexible printed circuit board 41 in the length direction of the flexible printed circuit board 41 by using the second fixing surface 3125 that has a concave-convex shape.

In this case, a channel having a concave-convex shape is formed between the positioning piece 312 and the first shaft cover 311, and a corresponding concave-convex shape is also formed on the flexible printed circuit board 41 that passes through the channel. In this way, the flexible printed circuit board 41 is in contact with a concave-convex channel wall, and is blocked by the channel wall, to prevent the flexible printed circuit board 41 from moving forward and backward in the length direction of the flexible printed circuit board 41.

In one embodiment, there may be one or a plurality of concave-convex shapes formed on the first fixing surface 3111 of the first shaft cover 311 and the second fixing surface 3125 of the positioning piece 312. When the first fixing surface 3111 and the second fixing surface 3125 have the plurality of concave-convex shapes, the plurality of concave-convex shapes may be sequentially arranged in the length direction of the flexible printed circuit board 41. In this way, the flexible printed circuit board 41 may be simultaneously limited by the plurality of concave-convex shapes, and correspondingly has a plurality of curved segments or bending segments. The plurality of curved segments or bending segments may work together to generate resistance, which has a relatively good positioning effect to the flexible printed circuit board 41 in the length direction.

When the first fixing surface 3111 and the second fixing surface 3125 have a plurality of concave-convex shapes, a shape and a size of the concave-convex shape are limited by bending performance of the flexible printed circuit board 41. For example, a height of a protrusion or a depression in a single concave-convex shape is greater than a minimum bendable radius of the flexible printed circuit board 41, to avoid damage or even rupture caused by excessive bending of the flexible printed circuit board 41.

To simplify the structure of the positioning piece 312 and reduce manufacturing costs, the first fixing surface 3111 of the first shaft cover 311 and the second fixing surface 3125 of the positioning piece 312 may have relatively simple shapes. In this case, the first fixing surface 3111 and the second fixing surface 3125 each may have a convex or concave shape. The convex or concave shape matches a shape of a corresponding part on the first shaft cover 311, so that the flexible printed circuit board 41 has an entire curved part or an entire bent part in a space formed between the second fixing surface 3125 and the first shaft cover 311, and the curved part presses against a convex or concave part of the second fixing surface 3125, to position the flexible printed circuit board 41 in the length direction. In this embodiment, an example in which the second fixing surface 3125 has a concave shape and the first fixing surface 3111 has a corresponding convex shape is used for description.

When the first fixing surface 3111 and the second fixing surface 3125 are concave-convex surfaces, in one embodiment, the first fixing surface 3111 and the second fixing surface 3125 may generate a convex or concave shape in a straight-line bending manner. For example, as shown in FIG. 21, the first fixing surface 3111 has a plurality of straight-line bending segments 3111a, and the second fixing surface 3125 also has a plurality of straight-line bending segments 3125a correspondingly. The straight-line bending segments 3111a of the first fixing surface 3111 form a protrusion shape. Correspondingly, the straight-line bending segments 3125a of the second fixing surface 3125 form a recess shape. In this way, shapes of the first fixing surface 3111 and the second fixing surface 3125 match each other, a bent channel is formed, and the channel protrudes to one side of the positioning piece 312. In this way, a protrusion and a recess formed by bending a straight line may have a relatively large bending angle, and have a relatively good fastening effect on the flexible printed circuit board 41.

In another embodiment structure, the second fixing surface 3125 may be an arc-shaped surface, and the first fixing surface 3111 that is of the first shaft cover 311 and that faces the second fixing surface 3125 is also an arc-shaped surface. In this case, the first fixing surface 3111 and the second fixing surface 3125 each do not have a bending-angle structure such as an acute edge or a sharp angle. A part that is of the flexible printed circuit board 41 and that is in contact with the positioning piece 312 and a part that is of the flexible printed circuit board 41 and that is in contact with the first shaft cover 311 are arc surfaces with smooth transition. No fold or surface scratch is generated on the surface of the flexible printed circuit board 41 due to pressure of the acute edge.

In addition, the positioning piece 312 may further have another structure or shape used to position the flexible printed circuit board 41 in a length direction. Details are not described herein.

It should be noted that the electrical connection line 4 may include one or more flexible printed circuit boards 41. When there is at least one flexible printed circuit board 41, the plurality of flexible printed circuit boards 41 may be disposed in a top-down stacking manner, and are fastened together by the first shaft cover 311 and the positioning piece 312 in the rotating shaft assembly 3.

In addition to the flexible printed circuit board 41, the electrical connection line 4 may further include scattered cables 42. Different from the flexible printed circuit board 41, the cable 42 is usually disposed as a single cable. In this way, a radial size of the cable 42 is far less than a size of the cable 42 in a length direction. Therefore, when the positioning piece 312 is used to position the cable 42, compared with the flexible printed circuit board 41, the positioning piece 312 requires a more compact limiting structure.

In one embodiment, the second fixing surface 3125 of the positioning piece 312 is provided with a guide groove 3123, and a cable segment that is of the cable 42 and that is located between the positioning piece 312 and the first shaft cover 311 may be partially or all buried in the guide groove 3123.

To position the cable 42 in the length direction of the cable 42 and reduce or avoid sliding of the cable 42 relative to the positioning piece 312 in the length direction, the guide groove 3123 may correspondingly have a plurality of different guide groove shapes and structures, and cooperate with the cable 42 for positioning. The following describes various possible forms of the guide groove 3123 and corresponding limiting manners of the cable 42.

Figure 22:
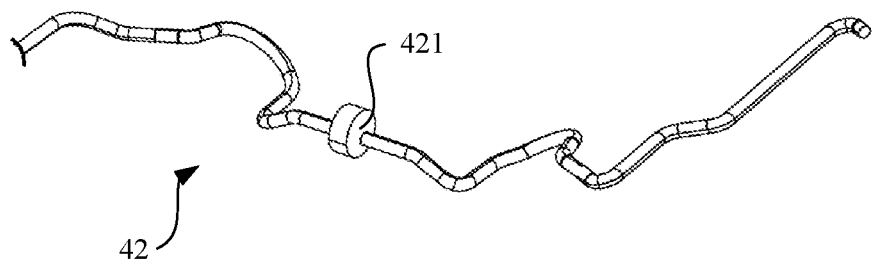
FIG. 22 is a schematic diagram of a structure of a cable according to an embodiment of this application.

FIG. 22 is a schematic diagram of a structure of the cable according to this embodiment of this application. As shown in FIG. 22, in one embodiment, a positioning structure may be disposed on an outer surface of the cable 42. The positioning structure may cooperate with a corresponding structure of the guide groove 3123, so that the positioning piece 312 positions the cable 42 in a length direction of the cable 42.

It may be understood that because the cable 42 is fastened in the guide groove 3123 of the positioning piece 312, a structure that matches the positioning structure of the cable 42 may be disposed in the guide groove 3123. In one embodiment, the positioning structure on the outer surface of the cable 42 may be an axial positioning protrusion 421. The axial positioning protrusion 421 protrudes in a radial direction of the cable 42.

Figure 23:
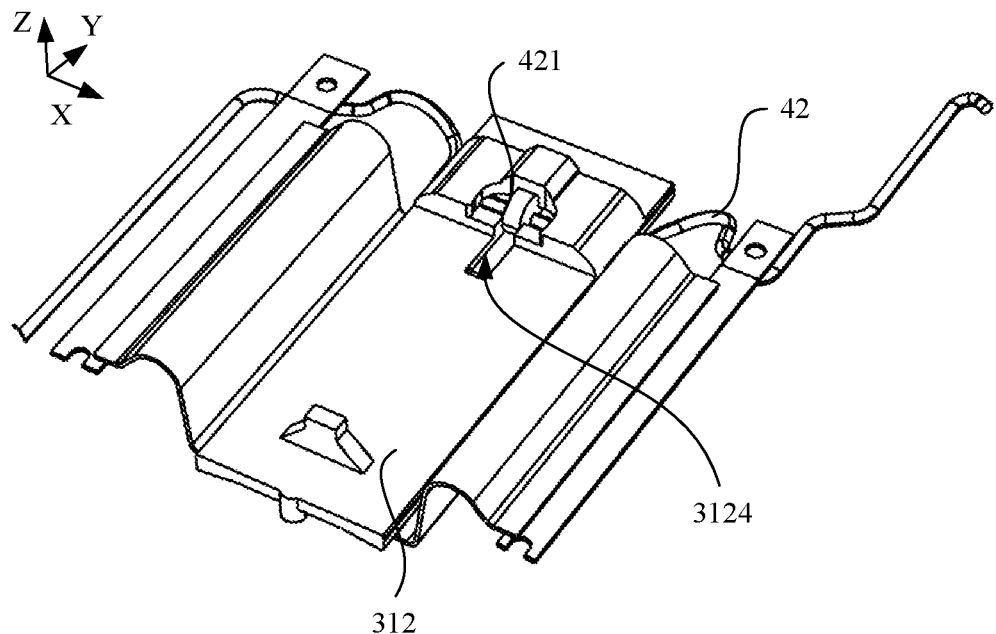
FIG. 23 is a schematic diagram of a connection structure in a first direction when a positioning piece is connected to a cable according to an embodiment of this application.
Figure 24:
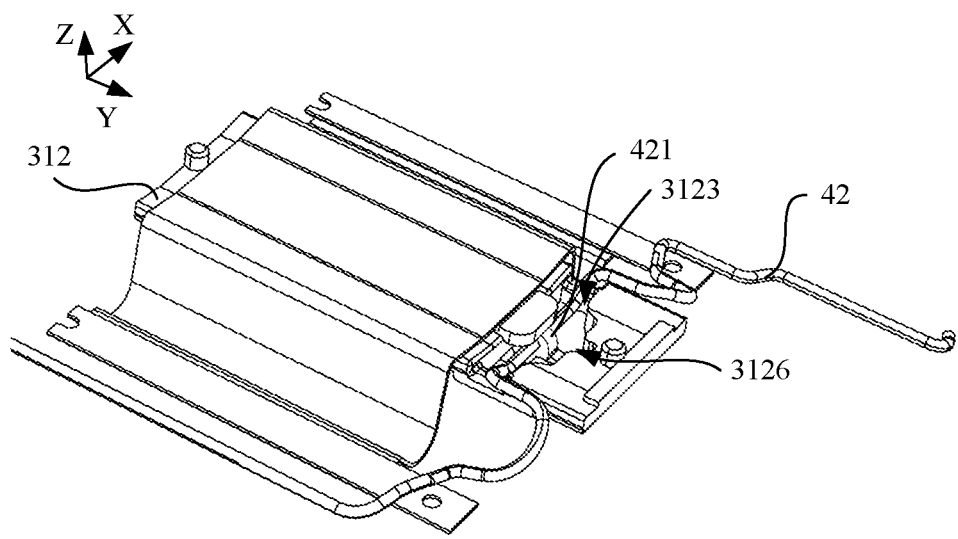
FIG. 24 is a schematic diagram of a connection structure in a second direction when a positioning piece is connected to a cable according to an embodiment of this application.

FIG. 23 is a schematic diagram of a connection structure in a first direction when the positioning piece is connected to the cable according to this embodiment of this application. FIG. 24 is a schematic diagram of a connection structure in a second direction when the positioning piece is connected to the cable according to this embodiment of this application. As shown in FIG. 23 and FIG. 24, in one embodiment, the guide groove 3123 may pass through the positioning piece 312 in a length extension direction of the cable 42, a groove opening of the guide groove 3123 faces the first shaft cover 311, and openings of the guide groove 3123 are formed in end surfaces of two opposite sides of the positioning piece 312. The cable 42 may penetrate into the guide groove 3123 through the two opposite openings. Slot walls on the two sides of the guide groove 3123 may limit a radial position of the cable 42. In this way, the cable 42 is constrained in the guide groove 3123.

Corresponding to the axial positioning protrusion 421 on the cable 42, a recess part 3124 corresponding to the axial positioning protrusion 421 may be disposed in the guide groove 3123. A shape and a position of the recess part 3124 correspond to a shape and a position of the axial positioning protrusion 421. When the cable 42 is disposed in the guide groove 3123, the axial positioning protrusion 421 of the cable 42 is located in the recess part 3124, and side walls of the recess part 3124 may limit displacement of the cable 42 in a length direction.

The positioning structure of the cable 42 may have a plurality of different forms. In one embodiment, an injection-molded part may be used to form a positioning structure of the cable 42. The injection-molded part may be formed on the outer surface of the cable 42 in an injection molding manner. In addition, strength of a connection between the injection-molded part and a main body of the cable 42 is relatively high, and a structure is relatively reliable. Furthermore, another material or component may be used to form a positioning structure on the outer surface of the cable 42. This is not limited herein.

A person skilled in the art easily understands that, because the axial positioning protrusion 421 protrudes from the outer surface of the cable 42, to accommodate the cable 42 having the axial positioning protrusion 421 inside the guide groove 3123, the guide groove 3123 needs to have an avoidance notch 3126 that is convenient to place the cable 42.

A size and a shape of the avoidance notch 3126 are adapted to a size and a shape of the cable 42 having the axial positioning protrusion 421. In one embodiment, a size of the avoidance notch 3126 in a radial direction of the cable 42 is greater than a maximum radial size of the cable 42 having the axial positioning protrusion 421, so that the cable 42 can be placed into the guide groove 3123 through the avoidance notch 3126. A position of the avoidance notch 3126 may be opposite to or staggered from the recess part 3124. After entering the guide groove 3123, the cable 42 may move to a position at which the axial positioning protrusion 421 is matched and clamped with the recess part 3124, so that the cable 42 is positioned, as shown in FIG. 22.

In addition, a main body of the positioning piece 312 provided with the avoidance notch 3126 and the guide groove 3123 has a relatively complex shape and contour, and the positioning piece 312 may be integrally formed in a manner such as injection molding. Correspondingly, in one embodiment, the positioning piece 312 may be provided with an auxiliary hole 3128, and both the avoidance notch 3126 and the recess part 3124 are connected to the auxiliary hole 3128, so that a mold can extend into the avoidance notch 3126 and the recess part 3124 through the auxiliary hole 3128, to facilitate injection molding of the positioning piece 312. For a shape and position of a structure such as the auxiliary hole 3128, refer to the foregoing illustration of the positioning piece 312.

In one embodiment, the guide groove 3123 may be bent toward a thickness direction of the flexible printed circuit board 41. For example, the guide groove 3123 may form a concave-convex shape similar to that of the second fixing surface 3125, to limit the cable 42 in the length direction of the cable 42. In one embodiment, as shown in FIG. 22, edges of the guide groove 3123 are higher than a middle part of the guide groove 3123, so that operations 3123a are formed at the edges of the guide groove 3123. For a shape and structure of the operation 3123a, refer to the foregoing diagram of the positioning piece 312. When the guide groove 3123 is bent toward the thickness direction of the flexible printed circuit board 41, a structure of the concave-convex shape formed by the guide groove 3123 is relatively similar to the concave-convex structure of the second fixing surface 3125. For details, refer to the foregoing description of the concave-convex structure of the second fixing surface 3125. Details are not described herein again.

Figure 25:
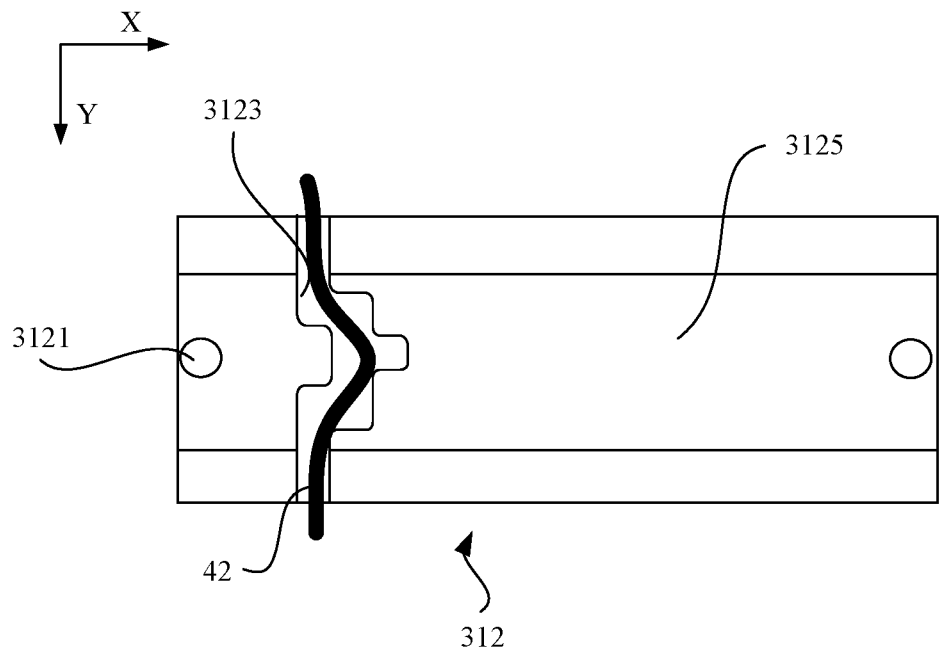
FIG. 25 is a schematic diagram of another connection structure when a positioning piece is connected to a cable according to an embodiment of this application.

In one embodiment, the guide groove 3123 may further separately limit the cable 42 in the length direction by using a bent shape. FIG. 25 is a schematic diagram of another connection structure when a positioning piece is connected to a cable according to an embodiment of this application. As shown in FIG. 25, a guide groove 3123 of a positioning piece 312 has at least one bending segment. A bending direction of the bending segment faces a radial direction of a cable 42. The cable 42 disposed in the guide groove 3123 forms a bending shape under pressure of groove walls of the guide groove 3123. When the cable 42 tends to move in a length direction of the cable 42, the bending groove walls of the guide groove 3123 may block movement of the cable 42, so that the cable 42 is maintained at an original position. In addition, in one embodiment, the bending direction of the guide groove 3123 may protrude to a side of a flexible printed circuit board 41. In this way, under a guiding effect of the guide groove 3123, an end part of the cable 42 extends to a side away from the flexible printed circuit board, thereby preventing interference between the cable 42 and the flexible printed circuit board 41.

Different from the flexible printed circuit board 41 that has a relatively large width, the cable 42 has relatively small radial sizes in all directions. Therefore, the guide groove 3123 may directly clamp the cable 42 inside the guide groove 3123, and limitation of the flexible printed circuit board 41 in an X-axis direction is completed without the need of cooperation between a second fixing surface 3125 and a first shaft cover 311. In this way, the guide groove 3123 may have a uniform groove depth, and a groove width of a part between groove walls on two sides of the guide groove 3123 may match an outer diameter of the cable 42, so that the cable 42 is limited and fastened.

In one embodiment, refer to FIG. 25. The entire guide groove 3123 extends in a width direction (a Y-axis direction) of the positioning piece 312, the guide groove 3123 has the bending segment, and the bending segment is bent toward a length direction (an X-axis direction in the figure) of the positioning piece 312. To achieve a better positioning effect for the cable 42, the guide groove 3123 in FIG. 25 has a plurality of bending segments that are sequentially connected. These bending segments guide a plurality of different segments of the cable 42 in different directions. The guide groove 3123 causes relatively great resistance to the cable 42 to prevent the cable 42 from sliding relative to a cable groove in a length direction.

As shown in FIG. 25, as an embodiment structure of the guide groove 3123, the bending segments of the guide groove 3123 may be symmetrically disposed relative to a central axis of the positioning piece 312. In this case, the central axis of the positioning piece 312 serves as a boundary, and the cable 42 is divided into two segments connected to different frames. The bending segments on different sides of the central axis impose close or even same resistance on the cable 42. Therefore, when the cable 42 is bent and deforms, the cable segments on both sides of the positioning piece 312 are under a same stress and generate same deformation, and a case in which a segment of the cable 42 on one side of the positioning piece 312 generates large deformation while a segment of the cable 42 on the other side of the positioning piece 312 generates slight deformation is not generated.

When the guide groove 3123 has a plurality of bending segments, smooth transition may be performed between the bending segments by using a curved surface, to prevent the cable 42 from being scratched due to sharp angles or acute edges of the guide groove 3123.

Similar to fastening of the flexible printed circuit board 41, when the guide groove 3123 limits the cable 42, a bending angle and a bending radius formed by the bending segments are greater than a minimum bendable radius of the cable 42, to avoid damage or break of the cable 42 located in the guide groove 3123 due to an excessively large bending degree of the guide groove 3123.

When the positioning piece 312 and the first shaft cover 311 position the electrical connection line 4, a bonding agent may be used to assist in positioning the flexible printed circuit board 41, the cable 42, and the like. In this case, a dispensing operation may be performed on a part that is of the flexible printed circuit board 41 or the cable 42 and that is in contact with the rotating shaft assembly 3, and the flexible printed circuit board 41 or the cable 42 and the positioning piece 312 are fastened together by using a bonding force of the bonding agent.

The electrical connection line 4 may include both the flexible printed circuit board 41 and a cable 42 that is arranged in a single manner. To enable the positioning piece 312 to position both the flexible printed circuit board 41 and the single cable 42, the guide groove 3123 of the positioning piece 312 is located outside a region that is of the second fixing surface 3125 and that is attached to the flexible printed circuit board 41. In other words, regions that are of the guide groove 3123 and the second fixing surface 3125 and that are used to position the flexible printed circuit board 41 are disposed in parallel. Correspondingly, the flexible printed circuit board 41 and the single arranged cable 42 are also arranged in parallel.

To connect an end part of the electrical connection line 4 to a corresponding frame, the frame also has a fastening structure for fastening the electrical connection line 4. In this way, determined relative positions exist between an end part of the electrical connection line 4 and the frame. No matter whether the frame rotates to any position, the end part of the electrical connection line 4 is reliably connected to the frame, and is electrically connected to a corresponding component such as a mainboard, an antenna, or a flexible screen in the frame.

The electrical connection line 4 may include different components such as the flexible printed circuit board 41 and the single cable 42, and the flexible printed circuit board 41 and the single cable 42 have different structures and shapes. Therefore, for the flexible printed circuit board 41 and the cable 42, the frame may fasten ends of the flexible printed circuit board 41 and the cable 42 by using different fastening structures.

Figure 26:
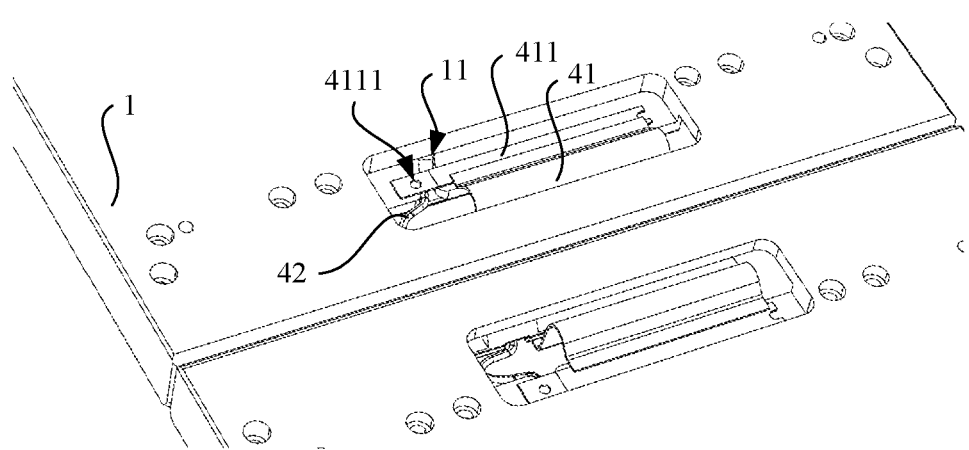
FIG. 26 is a schematic diagram of a connection structure between an electrical connection line and a frame in a foldable screen device according to an embodiment of this application.
Figure 27:
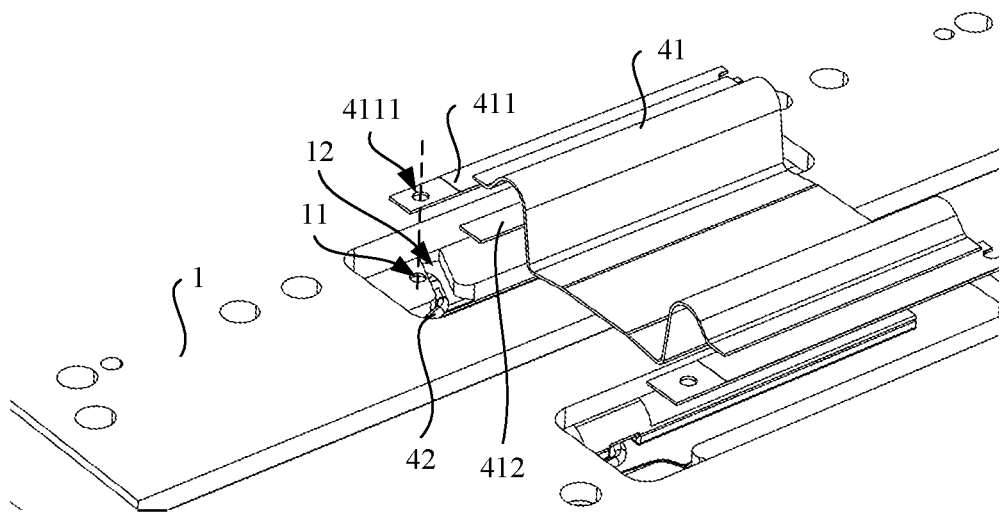
FIG. 27 is a schematic exploded view of the connection structure between the electrical connection line and the frame in FIG. 26.

FIG. 26 is a schematic diagram of a connection structure between the electrical connection line and the frame in the foldable screen device according to this embodiment of this application. FIG. 27 is a schematic exploded view of the connection structure between the electrical connection line and the frame in FIG. 26. As shown in FIG. 26 and FIG. 27, in one embodiment, a reinforcement steel sheet 411 is disposed at an end part of the flexible printed circuit board 41. The reinforcement steel sheet 411 may be connected to the end part of the flexible printed circuit board 41 in a bonding or press-fitting manner. In addition, the reinforcement steel sheet 411 has relatively strong mechanical performance, and may be provided with a fastening structure to bear a pulling force generated when the flexible printed circuit board 41 is fastened. In one embodiment, using an example in which the electrical connection line 4 is connected to the first frame, a first connection hole 4111 is disposed in the reinforcement steel sheet 411 at the end part of the flexible printed circuit board 41, a direction of the first connection hole 4111 is perpendicular to a board surface direction of the flexible printed circuit board 41, and a second connection hole 11 corresponding to the first connection hole 4111 is disposed in the first frame 1. When the first connection hole 4111 of the reinforcement steel sheet 411 matches and corresponds to the second connection hole 11 of the first frame 1, a fastener may pass through the first connection hole 4111 and the second connection hole 11 in sequence, so that the end part of the flexible printed circuit board 41 is fastened to the first frame 1.

In one embodiment, because a main body of the flexible printed circuit board 41 is made of a material such as a polyester film, structure strength is relatively poor, and it is difficult to dispose a structure such as a hole. Therefore, the reinforcement steel sheet 411 is disposed at the end part of the flexible printed circuit board 41, and the first connection hole 4111 is disposed in the reinforcement steel sheet 411. When the first connection hole 4111 matches and corresponds to the second connection hole 11, the first connection hole 4111 and the second connection hole 11 are disposed opposite to each other and concentrically, so that the first connection hole 4111 and the second connection hole 11 can be fastened by using a same fastener. The fastener may be a common fastener, for example, a threaded fastener such as a screw, or another fastener commonly used by a person skilled in the art such as a stud or a rivet, which is not limited herein.

The reinforcement steel sheet 411 maintains a relatively small thickness and also has relatively strong mechanical strength. Therefore, the end part of the flexible printed circuit board 41 can be reliably fastened. A length direction of the reinforcement steel sheet 411 may be consistent with a width direction of the flexible printed circuit board 41. In this way, in an entire width direction of the flexible printed circuit board 41, the flexible printed circuit board 41 is tightly pressed and fastened by the reinforcement steel sheet 411, thereby achieving a better positioning effect on the end part of the flexible printed circuit board 41.

When the end part of the flexible printed circuit board 41 is fastened to the frame, in one embodiment, an elastic cushion 412 may be disposed on the frame, and the elastic cushion 412 is located between the frame and the reinforcement steel sheet 411. In this case, because the elastic cushion 412 has a particular deformation capability, a particular gap is formed between the reinforcement steel sheet 411 and the corresponding frame, and an axial position of the reinforcement steel sheet 411 relative to the frame may change within a range of the gap, so that a position of a connection point between the end part of the flexible printed circuit board 41 and the frame may be slightly regulated. In this case, even if the position of the connection point between the end part of the flexible printed circuit board 41 and the frame has a small position error, for example, when a length of the flexible printed circuit board 41 is insufficient to reach the connection point between the flexible printed circuit board 41 and the frame, the error can be compensated by elastic deformation of the elastic cushion 412, thereby avoiding a risk that the flexible printed circuit board 41 is tensed or even broken due to the insufficient length.

In addition, the elastic cushion 412 may be made of a flexible material such as foam. Therefore, the elastic cushion 412 can also protect a surface of the end part of the flexible printed circuit board 41 to prevent an outer surface of the flexible printed circuit board 41 from being damaged by an external force. In one embodiment, the cushion 412 may cover a region in which the end part of the flexible printed circuit board 41 is correspondingly connected to a connecting piece. To improve insulation performance of the flexible printed circuit board 41 from another component, the elastic cushion 412 may be made of insulation foam.

In addition, to assist in fastening the reinforcement steel sheet 411, in one embodiment, a positioning steel sheet may be further disposed on the frame, and a third connection hole is disposed in the positioning steel sheet. The positioning steel sheet may be disposed on the reinforcement steel sheet 411, and the positioning steel sheet is located on a side that is of the reinforcement steel sheet 411 and that is away from the frame. In this case, the fastener may sequentially pass through the third connection hole, the first connection hole, and the second connection hole, so that the positioning steel sheet, the elastic cushion 412, the reinforcement steel sheet 411, and the frame are fastened together in an axial direction of the fastener.

In this case, the elastic cushion 412 may have a plurality of different positions. The elastic cushion 412 may be disposed between the reinforcement steel sheet 411 and the frame, and the elastic cushion 412 may alternatively be disposed between the positioning steel sheet and the reinforcement steel sheet 411. Alternatively, the elastic cushion 412 may be disposed between the reinforcement steel sheet 411 and the frame, or between the positioning steel sheet and the reinforcement steel sheet 411.

When the cable 42 is fastened on the frame, in one embodiment, a cable groove 12 may be provided in the frame, and the cable 42 is buried in the cable groove 12. A position and a direction of the cable 42 may be constrained by using the cable groove 12.

To prevent the cable 42 from being detached from the interior of the cable groove 12, the frame may use another positioning structure or positioning manner to assist in positioning the cable 42. In one embodiment, the cable 42 may be bonded to the cable groove 12 by using a bonding agent. In one embodiment, after the cable 42 is installed inside the cable groove 12, the cable 42 and the cable groove 12 may be bonded together in a glue dispensing manner.

In one embodiment, the reinforcement steel sheet 411 may also be configured to assist in positioning the cable 42. In one embodiment, the reinforcement steel sheet 411 may cover a region in which the cable groove 12 is located, and is pressed on an outer side of the cable 42. In this case, displacement of the cable 42 in each circumferential direction is constrained by the reinforcement steel sheet 411 or the cable groove, and therefore, the position of the cable 42 is limited. In this case, the same reinforcement steel sheet 411 is used to position the flexible printed circuit board 41 and the cable 42. In this way, limited space inside the foldable screen device can be effectively used, so that the device is more compact.

In addition, another material having relatively good mechanical performance may also be used to replace the reinforcement steel sheet 411. For example, a high-strength plastic material may be used to reinforce and position the end part of the flexible printed circuit board 41.

In one embodiment, the surface of the cable 42 may be further wrapped with acetic acid cloth for protecting the cable 42. The acetic acid cloth may be located between an outer surface of the cable 42 and a contact surface of another structure, and has a cushioning and insulation effect to some extent. In addition, the surface of the cable 42 may also be protected by using an injection molding structure or other manners well known by a person skilled in the art, which is not limited herein.

In addition, to fasten an end part of the flexible printed circuit board 41 or the cable 42, the frame may further have a positioning structure and a positioning component in another form and structure. This is not limited herein.

Figure 28:
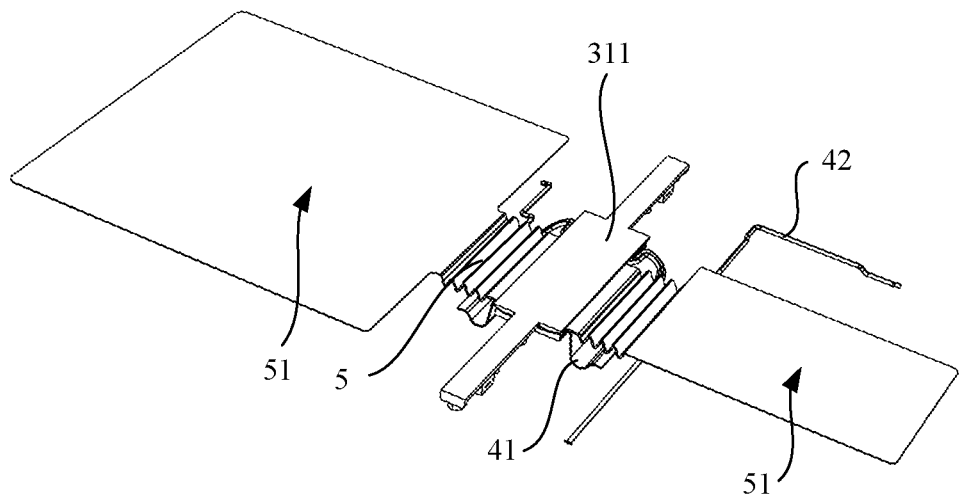
FIG. 28 is a schematic diagram of an inner-side connection of a flexible protective cover in a foldable screen device according to an embodiment of this application.
Figure 29:
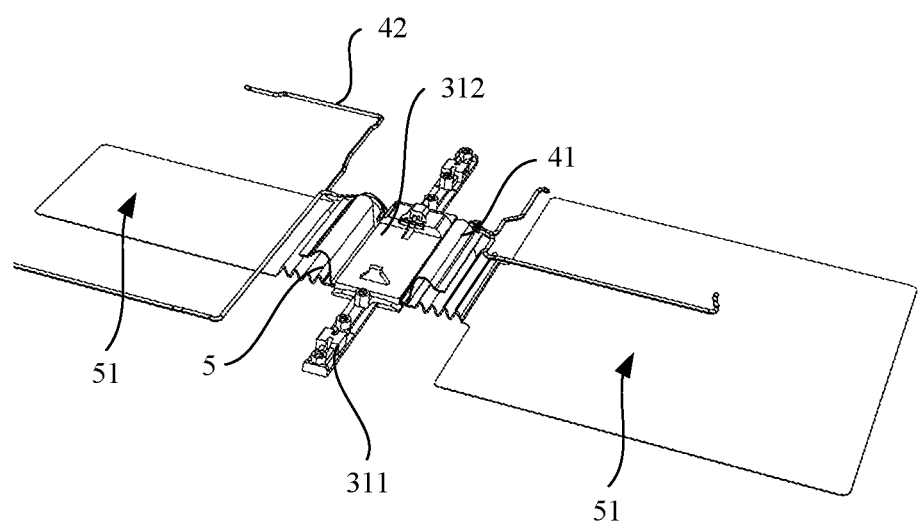
FIG. 29 is a schematic diagram of an outer-side connection of a flexible protective cover in a foldable screen device according to an embodiment of this application.

After the electrical connection line 4 is positioned and fastened, the electrical connection line 4 still has a particular free deformation capability. Therefore, when the foldable screen device is opened and closed, the electrical connection line 4 may scratch another component or structure outside the electrical connection line 4. To avoid scratching between the electrical connection line 4 and another structure, in one embodiment, a flexible protective cover is further disposed at a joint position of the two frames. FIG. 28 is a schematic diagram of an inner-side connection of the flexible protective cover in the foldable screen device according to this embodiment of this application. FIG. 29 is a schematic diagram of an outer-side connection of the flexible protective cover in the foldable screen device according to this embodiment of this application. As shown in FIG. 28 and FIG. 29, edges of two opposite sides of the flexible protective cover 5 are respectively connected to two frames, and a main body of the flexible protective cover 5 covers a side of the electrical connection line 4. When the foldable screen device is opened and closed, the flexible protective cover 5 is blocked between the electrical connection line 4 and an outer structure, to prevent the outer structure from contacting the electrical connection line 4.

When the foldable screen device is opened and closed, the flexible printed circuit board 41 and the cable 42 in the electrical connection line 4 mostly face the inner side of the foldable screen device, that is, opening and closing ends of the foldable screen device are bent. Therefore, accordingly, the flexible protective cover 5 is disposed on a side that is of the electrical connection line 4 and that is close to the opening and closing ends of the foldable screen device. To enable the flexible protective cover 5 to protect the electrical connection line 4 comprehensively, a size of the flexible protective cover 5 in a length direction of the rotating shaft 321 may be greater than or equal to a size of a region occupied by the electrical connection line 4 in this direction. In this case, parts of the electrical connection line 4 between the two frames are all covered and protected by the flexible protective cover 5.

The flexible protective cover 5 is made of a soft material. Therefore, even if the electrical connection line 4 comes into contact with the flexible protective cover 5, the flexible protective cover 5 does not damage a surface of the electrical connection line 4.

In one embodiment, the flexible protective cover 5 may be a corrugated protective cover. In this case, the entire flexible protective cover 5 has an uneven corrugated surface, and the corrugated surface may be correspondingly unfolded or folded when the foldable screen device is opened or closed, to form protection regions of different sizes to adapt to different opening and closing angles of the foldable screen device.

Different components may be disposed in different frames of the foldable screen device, and these components have different power and heat. As heat accumulates, different frames may have a relatively large temperature difference. Consequently, display effects of parts that are of the flexible screen and that correspond to the different frames are affected, and a display uniformity problem such as a color cast in a local area of the screen is caused. Therefore, the flexible protective cover 5 connected between the different frames may have a particular heat transfer capability, to transfer heat between the different frames, reduce the temperature difference between the different frames, and improve display uniformity of the flexible screen.

In one embodiment, the flexible protective cover 5 may be made of a thermally conductive film. The thermally conductive film may be made of a material such as graphite or carbon fiber, and has a relatively good thermal conductivity. In this way, the flexible protective cover 5 connected between the different frames can transfer heat on a frame to another frame, so that temperatures of the two frames are relatively uniform. In addition, all parts that are of the flexible screen and that are correspondingly disposed on the different frames also have relatively good display uniformity.

In this case, in one embodiment, the flexible protective cover 5 may have a heat dissipation surface 51 that fits the frame (not shown in the figure). The heat dissipation surface 51 has a relatively large heat dissipation area. Therefore, the flexible protective cover 5 can implement a relatively fast heat conduction speed by using the heat dissipation surface 51 and the frame, so that there is relatively good temperature uniformity between the first frame 1 and the second frame 2.

In this embodiment, a foldable screen device includes a first frame, a second frame, and a rotating shaft assembly connected between the first frame and the second frame. A connection structure in the rotating shaft assembly forms a channel through which an electrical connection line can pass and that can fasten the electrical connection line. In addition, in the connection structure, a magnetic piece is disposed to assist in positioning the connection structure and the electrical connection line. In this way, the electrical connection line is positioned by the rotating shaft assembly, so that bending deformation generated by the electrical connection line when the foldable screen device is folded is relatively small, and a bending amount is prone to control. Therefore, connection reliability is high.

Scenario 2

Figure 30:
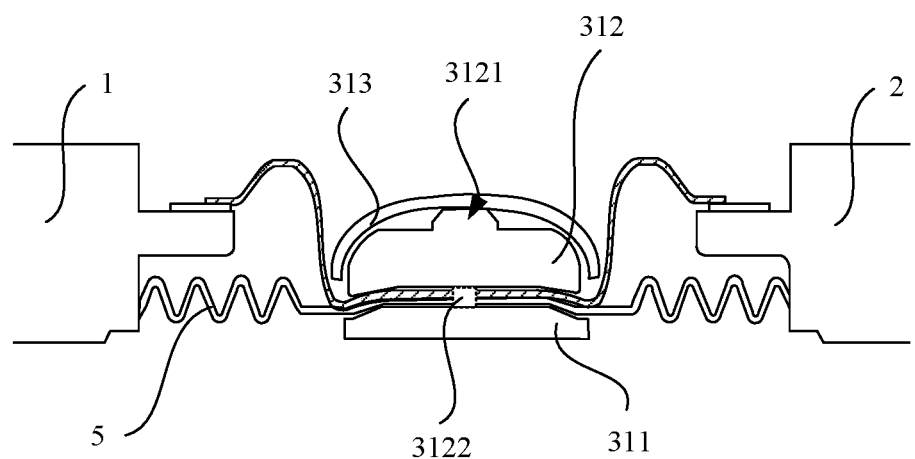
FIG. 30 is a schematic diagram of a cross section of a connection structure in another foldable screen device according to an embodiment of this application.
Figure 31:
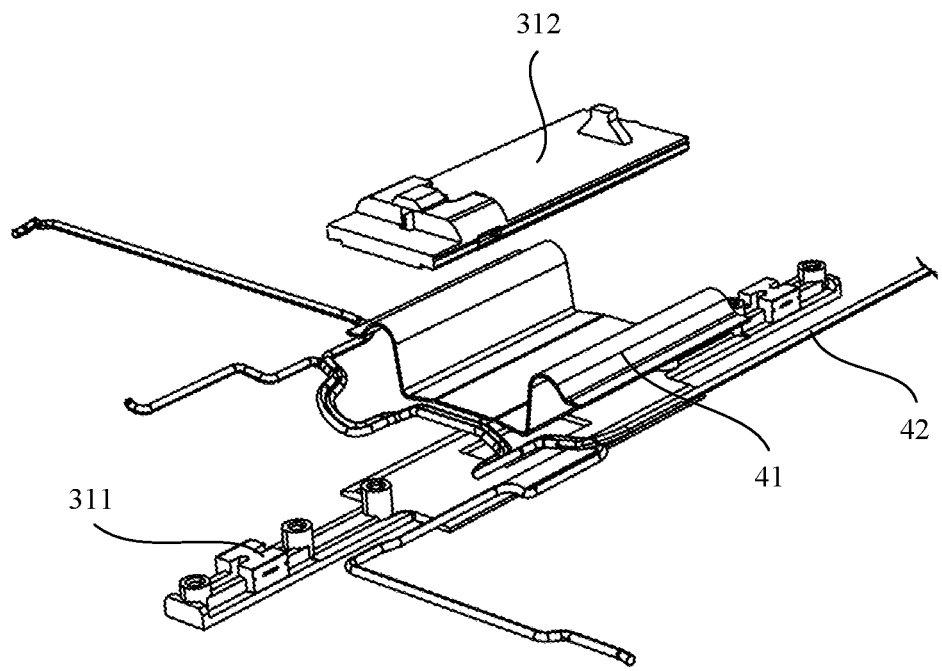
FIG. 31 is a schematic structural diagram of a connection structure in another foldable screen device in a first direction according to an embodiment of this application.
Figure 32:
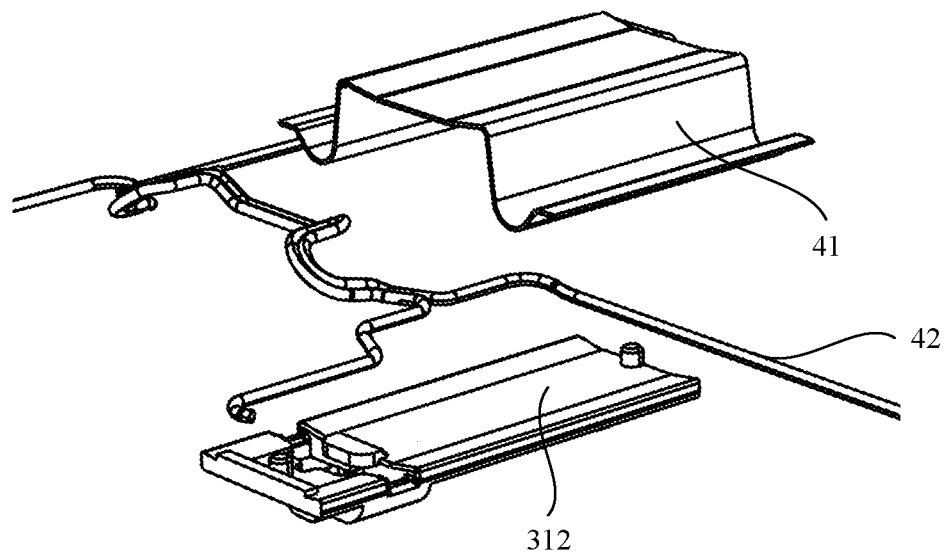
FIG. 32 is a schematic structural diagram of a connection structure in another foldable screen device in a second direction according to an embodiment of this application.

In the foldable screen device, when an electrical connection line 4 is positioned by using a connection structure 31 in a rotating shaft assembly 3, the electrical connection line 4 is fastened without the aid of a magnetic piece, but is limited only by using cooperation between a positioning piece 312 in the connection structure 31 and a first shaft cover 311. FIG. 30 is a schematic diagram of a cross section of a connection structure in another foldable screen device according to an embodiment of this application. FIG. 31 is a schematic structural diagram of the connection structure in the another foldable screen device in a first direction according to this embodiment of this application. FIG. 32 is a schematic structural diagram of the connection structure in the another foldable screen device in a second direction according to this embodiment of this application. As shown in FIG. 30 to FIG. 32, main structures, functions, and working principles of the foldable screen device in this embodiment are similar to those of the foldable screen device in the foregoing scenario 1, and details are not described herein again. A difference between this scenario and the foregoing scenario 1 lies in that the connection structure 31 included in the rotating shaft assembly 3 of the foldable screen device in this scenario does not include a magnetic piece. In this case, the connection structure 31 mainly includes the first shaft cover 311, a second shaft cover 313, and the positioning piece 312. The positioning piece 312 is located between the second shaft cover 313 and the first shaft cover 311, and the electrical connection line 4 is located between the positioning piece 312 and the first shaft cover 311.

In one embodiment, in this scenario, the first shaft cover 311, the second shaft cover 313, and the positioning piece 312 in the connection structure 31 have structures similar to those in the foregoing scenario, and the positioning piece 312 may be installed between the first shaft cover 311 and the second shaft cover 313 by using the structure in the foregoing scenario. For overall structures and relative positions of the first shaft cover 311, the second shaft cover 313, and the positioning piece 312, refer to the descriptions in the foregoing scenario 1. In this case, because the connection structure 31 does not include the magnetic piece, a second fixing surface 3125 of the positioning piece 312 and a first fixing surface 3111 of the first shaft cover 311 each may be a flat surface, and no installation slot needs to be provided.

In this embodiment, the foldable screen device includes a first frame, a second frame, and the rotating shaft assembly connected between the first frame and the second frame. The connection structure in the rotating shaft assembly forms a channel through which an electrical connection line can pass and that can fasten the electrical connection line. In this way, the electrical connection line is positioned by the rotating shaft assembly, so that bending deformation generated by the electrical connection line when the foldable screen device is folded is relatively small, and a bending amount is prone to control. Therefore, connection reliability is high.

What is claimed is:

1. A foldable screen device comprising:
   two frames;
   an electrical connection line; and
   a rotating shaft assembly articulated with the two frames, wherein the two frames are capable of rotating around rotating shafts of the rotating shaft assembly to be closed or opened, and, the rotating shaft assembly comprises hinges and a connection structure, wherein, the hinges are connected between the connection structure and the frame, the connection structure has a channel passing through two opposite sides of the rotating shaft assembly, two ends of the electrical connection line are respectively connected to the two frames, the electrical connection line penetrates into the channel, the channel and the hinges, which comprise the rotating shafts, are located at different positions of the rotating shaft assembly in an axial direction, and the connection structure comprises a first shaft cover and a second shaft cover that enclose a space capable of accommodating the rotating shafts.

2. The foldable screen device according to claim 1, wherein, the connection structure is located in a middle region of the rotating shaft assembly in an axial direction.

3. The foldable screen device according to claim 2, wherein, the first shaft cover and the second shaft cover are disposed opposite to each other, the first shaft cover is located on a side that is of the rotating shaft assembly and that is close to articulated ends of the frames, the second shaft cover is located on a side that is of the rotating shaft assembly and that is close to free ends of the frames.

4. The foldable screen device according to claim 3, wherein, the connection structure further comprises a positioning piece, the positioning piece is located in the space jointly enclosed by the first shaft cover and the second shaft cover, and the channel is jointly formed by the positioning piece and one of the first shaft cover and the second shaft cover.

5. The foldable screen device according to claim 4, wherein, the positioning piece and the first shaft cover jointly enclose the channel.

6. The foldable screen device according to claim 5, further comprising a first magnetic piece and a second magnetic piece, wherein the first magnetic piece is disposed on the first shaft cover, the second magnetic piece is disposed on the positioning piece, and the first magnetic piece and the second magnetic piece are attractable to each other, so that the positioning piece and the first shaft cover are positioned to each other.

7. The foldable screen device according to claim 6, wherein, both the first magnetic piece and the second magnetic piece are magnets.

8. The foldable screen device according to claim 6, wherein, one of the first magnetic piece and the second magnetic piece is a magnet, and the other is a soft magnet.

9. The foldable screen device according to claim 6, wherein, the positioning piece comprises a first positioning part, the first positioning part is located on a side that is of the positioning piece and that faces the first shaft cover, and the top of the first positioning part protrudes from an outer side of another part of the positioning piece and presses against the first shaft cover.

10. The foldable screen device according to claim 9, wherein, at least two first positioning parts are distributed on two opposite sides of the positioning piece in an axial direction of the rotating shaft, and there is a spacing that is between the first positioning parts located on the two opposite sides in a length direction of the positioning piece that is used for the electrical connection line to pass through.

11. The foldable screen device according to claim 10, wherein, the positioning piece further comprises a second positioning part, and the second positioning part is located on a side that is of the positioning piece and that faces the second shaft cover, and is connected to the second shaft cover.

12. The foldable screen device according to claim 4, wherein, the electrical connection line comprises a flexible printed circuit board.

13. The foldable screen device according to claim 12, wherein, the first shaft cover has a first fixing surface facing the positioning piece, the positioning piece has a second fixing surface facing the first shaft cover, the first fixing surface and the second fixing surface are disposed opposite to each other to form the channel, and the flexible printed circuit board is clamped between the first fixing surface and the second fixing surface.

14. The foldable screen device according to claim 13, wherein, both the first fixing surface and the second fixing surface are concave-convex surfaces, and concave and convex directions of the concave-convex surfaces face a thickness direction of the flexible printed circuit board.

15. The foldable screen device according to claim 12, wherein, the electrical connection line further comprises a cable, and the flexible printed circuit board and the cable are spaced apart and disposed side by side.

16. The foldable screen device according to claim 15, wherein, a reinforcement steel sheet is disposed at an end part of the flexible printed circuit board, the reinforcement steel sheet is fastened to the frame, and an elastic cushion is disposed between the reinforcement steel sheet and the frame.

17. The foldable screen device according to claim 1, further comprising a flexible protective cover, wherein, edges of two opposite sides of the flexible protective cover are respectively connected to the two frames, and the flexible protective cover covers a side that is of the electrical connection line and that faces the free end of the frame.

18. The foldable screen device according to claim 17, wherein, the flexible protective cover has a corrugated cover body.

19. The foldable screen device according to claim 17, wherein, the flexible protective cover is made of a thermally conductive material.

20. The foldable screen device according to claim 19, wherein, the flexible protective cover has a heat dissipation surface that is attached to a surface of the frame.

* * * * *